US009557650B2

(12) United States Patent
De Dea et al.

(10) Patent No.: US 9,557,650 B2
(45) Date of Patent: Jan. 31, 2017

(54) TRANSPORT SYSTEM FOR AN EXTREME ULTRAVIOLET LIGHT SOURCE

(71) Applicant: ASML Netherlands B.V., Veldhoven (NL)

(72) Inventors: Silvia De Dea, San Diego, CA (US); Alexander I. Ershov, Escondido, CA (US); Brandon Verhoff, San Diego, CA (US); Gregory Wilson, San Diego, CA (US); Bruno M. La Fontaine, San Diego, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 14/740,916

(22) Filed: Jun. 16, 2015

(65) Prior Publication Data
US 2015/0282287 A1 Oct. 1, 2015

Related U.S. Application Data

(63) Continuation-in-part of application No. 14/022,026, filed on Sep. 9, 2013.

(60) Provisional application No. 62/163,255, filed on May 18, 2015.

(51) Int. Cl.
H05G 2/00 (2006.01)
G03F 7/20 (2006.01)

(52) U.S. Cl.
CPC ............ G03F 7/2039 (2013.01); H05G 2/005 (2013.01); H05G 2/008 (2013.01)

(58) Field of Classification Search
CPC ...................................... H05G 2/00

USPC ..................................................... 250/504 R
See application file for complete search history.

(56) References Cited

U.S. PATENT DOCUMENTS

| 3,476,907 | A | 11/1969 | Foex |
| 4,687,544 | A | 8/1987 | Bersin |
| 6,868,856 | B2 | 3/2005 | Nowak et al. |
| 7,372,049 | B2 | 5/2008 | Van Herpen et al. |
| 7,491,954 | B2 | 2/2009 | Bykanov |
| 8,624,208 | B2 | 1/2014 | Nagai |
| 8,872,142 | B2 | 10/2014 | Nagai |
| 2003/0010355 | A1 | 1/2003 | Nowak et al. |

(Continued)

OTHER PUBLICATIONS

Non-Final Office Action, U.S. Appl. No. 14/022,026, mailed Jan. 29, 2016, 32 pages.

(Continued)

Primary Examiner — Wyatt Stoffa
Assistant Examiner — Eliza Osenbaugh-Stewar
(74) Attorney, Agent, or Firm — DiBerardino McGovern IP Group LLC

(57) ABSTRACT

A system for an extreme ultraviolet (EUV) light source includes a radical transport system that includes one or more conduits, each of the one or more conduits comprising a sidewall, the sidewall comprising a linear portion and a second portion, the linear portion of the sidewall comprising a first end that defines a first opening, and the second portion of the sidewall comprising one or more openings from an interior of the conduit to an exterior of the conduit, where the second portion of at least one of the one or more conduits is positioned relative to a collector that is inside of a vacuum chamber of the EUV light source with a gap between the collector and the second portion; and a control system.

29 Claims, 20 Drawing Sheets

(56) References Cited

U.S. PATENT DOCUMENTS

| | | |
|---|---|---|
| 2003/0223546 A1 | 12/2003 | McGregor |
| 2004/0165160 A1 | 8/2004 | Van Beek |
| 2006/0097203 A1 | 5/2006 | Bykanov |
| 2007/0125964 A1 | 6/2007 | Van Herpen et al. |
| 2009/0057567 A1 | 3/2009 | Bykanov |
| 2011/0188011 A1 | 8/2011 | Ehm |
| 2011/0226745 A1 | 9/2011 | Nagai |
| 2012/0212136 A1 | 8/2012 | Einav |
| 2012/0223256 A1 | 9/2012 | Bykanov |
| 2012/0223257 A1* | 9/2012 | Nagai ............... G03F 7/70025 250/504 R |
| 2012/0313016 A1* | 12/2012 | Fleurov ............... H05G 2/008 250/504 R |
| 2013/0068161 A1* | 3/2013 | White ............... C23C 16/45578 118/723 R |
| 2013/0126761 A1 | 5/2013 | Nagai |
| 2014/0306115 A1* | 10/2014 | Kuritsyn ............ G02B 27/0006 250/358.1 |
| 2015/0008345 A1 | 1/2015 | Nagai |
| 2015/0069273 A1 | 3/2015 | De Dea et al. |
| 2015/0261094 A1* | 9/2015 | Huang ............... G03F 7/70033 355/67 |

OTHER PUBLICATIONS

R.K. Grubbs et al., "Attenuation of hydrogen radicals traveling under flowing gas conditions through tubes of different materials," J. Vac. Sci. Technol. A 24(3), May/Jun. 2006, pp. 486-496.

Non-Final Office Action, U.S. Appl. No. 14/022,026, mailed Feb. 20, 2015, 30 pages.

Final Office Action, U.S. Appl. No. 14/022,026, mailed Aug. 11, 2015, 21 pages.

Final Office Action, U.S. Appl. No. 14/022,026, mailed Jul. 7, 2016, 53 pages.

* cited by examiner

TRANSPORT SYSTEM FOR AN EXTREME ULTRAVIOLET LIGHT SOURCE

CROSS-REFERENCE TO RELATED APPLICATIONS

This application is a continuation-in-part of U.S. application Ser. No. 14/022,026, filed Sep. 9, 2013 and titled TRANSPORT SYSTEM FOR AN EXTREME ULTRAVIOLET LIGHT SOURCE, which is incorporated herein by reference in its entirety. This application claims the benefit of U.S. Provisional Application No. 62/163,255, filed May 18, 2015 and titled TRANSPORT SYSTEM FOR AN EXTREME ULTRAVIOLET LIGHT SOURCE, which is incorporated herein by reference in its entirety.

TECHNICAL FIELD

The disclosed subject matter relates to a transport system for an extreme ultraviolet light source.

BACKGROUND

Extreme ultraviolet ("EUV") light, for example, electromagnetic radiation having wavelengths of around 50 nm or less (also sometimes referred to as soft x-rays), and including light at a wavelength of about 13 nm, can be used in photolithography processes to produce extremely small features in substrates, for example, silicon wafers.

Methods to produce EUV light include, but are not necessarily limited to, converting a material that has an element, for example, xenon, lithium, or tin, with an emission line in the EUV range in a plasma state. In one such method, often termed laser produced plasma ("LPP"), the required plasma can be produced by irradiating a target material, for example, in the form of a droplet, plate, tape, stream, or cluster of material, with an amplified light beam that can be referred to as a drive laser. For this process, the plasma is typically produced in a sealed vessel, for example, a vacuum chamber, and monitored using various types of metrology equipment.

SUMMARY

In one general aspect, a system for an extreme ultraviolet (EUV) light source includes a radical transport system that includes one or more conduits, each of the one or more conduits including a sidewall, the sidewall including a linear portion and a second portion, the linear portion of the sidewall including a first end that defines a first opening, and the second portion of the sidewall including one or more openings from an interior of the conduit to an exterior of the conduit, where the second portion of at least one of the one or more conduits is positioned relative to a collector that is inside of a vacuum chamber of the EUV light source with a gap between the collector and the second portion; and a control system including one or more electronic processors; a non-transient computer-readable medium coupled to the one or more electronic processors, the computer-readable medium including instructions that, when executed, cause the one or more electronic processors to: control a flow of a gas through an aperture of the collector, control a flow of the gas through the gap between the second portion of the at least one of the one or more conduits and the collector, and control a flow of free radicals through the one or more openings in the second portion of the one or more conduits.

Implementations can include one or more of the following features. The second portion of at least one of the one or more conduits can be positioned relative to a perimeter of the collector that is inside of the vacuum chamber of the EUV light source, and the gap can be between the perimeter of the collector and the second portion. A perimeter of the second portion of the sidewall can have the same shape of at least a portion of the perimeter of the collector that is inside of a vacuum chamber of the EUV light source.

The flow of gas through the aperture can have a first flow rate, the flow of gas through the gap can have a second flow rate, and the flow of free radicals can have a third flow rate. The instructions to cause the one or more processors to control the flow of the gas through the aperture of the collector can include instructions to cause the one or more processors to adjust the first flow rate, the instructions to cause the one or more processors to control the flow of the gas through the gap can include instructions to cause the one or more processors to adjust the second flow rate, and the instructions to cause the one or more processors to control the flow of the free radicals can include instructions to cause the one or more processors to adjust the third flow rate. The instructions to cause the one or more processors to adjust the third flow rate can include instructions to cause the one or more processors to lower a pressure at the one or more openings in the second portion of the conduit relative to the first opening at the first end of the linear portion of the conduit. One or more of the first flow rate, the second flow rate, and the third flow rate can be adjusted until the first flow rate is the same as the sum of the second flow rate and the third flow rate.

The system also can include a source of free radicals coupled to the conduit at the first opening. The linear portion of the sidewall can pass through a wall of the vacuum chamber.

The perimeter of the collector can be curved, and the side wall of the second portion of the conduit can be curved. The perimeter of the collector can be a circle, and the side wall of the second portion of the conduit can form an arc of a circle. The perimeter of the collector can be in a first plane and the second portions of the conduits can be in a second plane, different from the first plane, and the second plane does not include any portion of the collector. The first plane and the second plane can be parallel to each other. The perimeter of the collector can be a circle, and the one or more conduits are two conduits, the shape of the second portion of the sidewall of each of the two conduits being arc of the circle, and each of the second portions being positioned relative to a different portion of the perimeter of the collector.

In some implementations, the second portion of the sidewall of at least one of the conduits includes more than one opening, each of the more than one opening having a different diameter. The second portion of the sidewall of each of the conduits can include more than one opening, each of the more than one openings having a different diameter. The second portion of the sidewall of each of the conduits can include more than one opening, each of the more than one opening being spaced from the nearest opening on the second portion of the sidewall by a spacing distance. The spacing distance can vary. For example, the spacing distance can decrease as the distance from the linear portion increases.

In some implementations, the system also includes a mount including a lip, the lip having the same shape as a perimeter of the collector, where the collector is placed in the mount with a space between the perimeter of the collector and the lip, the gap between the perimeter of the collector and the second portion of the one or more conduits is the space, and at least some of the gas that flows through the gap between the second portion of the one or more conduits and the perimeter of the collector flows through the space.

The free radicals can include hydrogen radicals, and the gas can include hydrogen gas.

In another general aspect, a method of removing debris from an element inside of a vacuum chamber of an extreme ultraviolet (EUV) light source includes directing free radicals toward a surface of the element inside of a vacuum chamber of an EUV light source, the free radicals flowing from a perimeter region of the element at a first flow rate; directing a gas toward the surface of the element inside of a vacuum chamber of an EUV light source, the gas flowing from a perimeter region of the element at a second flow rate and through an aperture in the center of the element at a third flow rate; and adjusting one or more of the first flow rate and the second flow rate relative to the third flow rate.

Implementations can include one or more of the following features. Adjusting the first flow rate and the second flow rate relative to the third flow rate can include adjusting one or more of the first flow rate and the second flow rate until the sum of the first flow rate and the second flow rate are the same as the third flow rate. Adjusting the first flow rate and the second flow rate relative to the third flow rate can include adjusting the first flow rate and the second flow rate until the sum of the first flow rate and the second flow rate are the same as the third flow rate.

The free radicals and the gas can be directed toward the surface of the element while a plasma that emits EUV light is generated in the vacuum chamber. The free radicals and the gas that flows from the perimeter region of the element can flow radially inward from the region at a perimeter of the element toward a center region of the element.

In another general aspect, a control system for controlling free radical and gas flow in an extreme ultraviolet (EUV) light source includes one or more electronic processors; a non-transient computer-readable medium coupled to the one or more electronic processors, the computer-readable medium including instructions that, when executed, cause the one or more electronic processors to direct a gas through an aperture of an element in a vacuum chamber of an extreme ultraviolet (EUV) light source, the gas having a first flow rate and the gas flowing from a first side of the element to a second side of the element, the second side of the element including a surface that is exposed to plasma debris, direct a perimeter flow from a perimeter region of the second side of the element inside of the vacuum chamber, the perimeter flow including free radicals and a gas, and adjust a total flow rate of the perimeter flow relative to a flow rate of the gas that flows through the aperture of the element.

Implementations can include one or more of the following features. The instructions to adjust the total flow rate of the perimeter flow relative to the flow rate of the gas that flows through the aperture of the element can include instructions to adjust the total flow rate of the perimeter flow to be the same as the flow rate of the gas that flows through the aperture of the element.

Implementations of any of the techniques described above may include a transport system for a laser produced plasma EUV light source, an EUV light source, a system for retrofitting an EUV light source, a method, a process, a device, executable instructions stored on a computer readable medium, or an apparatus. The details of one or more implementations are set forth in the accompanying drawings and the description below. Other features will be apparent from the description and drawings, and from the claims.

DRAWING DESCRIPTION

DESCRIPTION

Figure 1A:
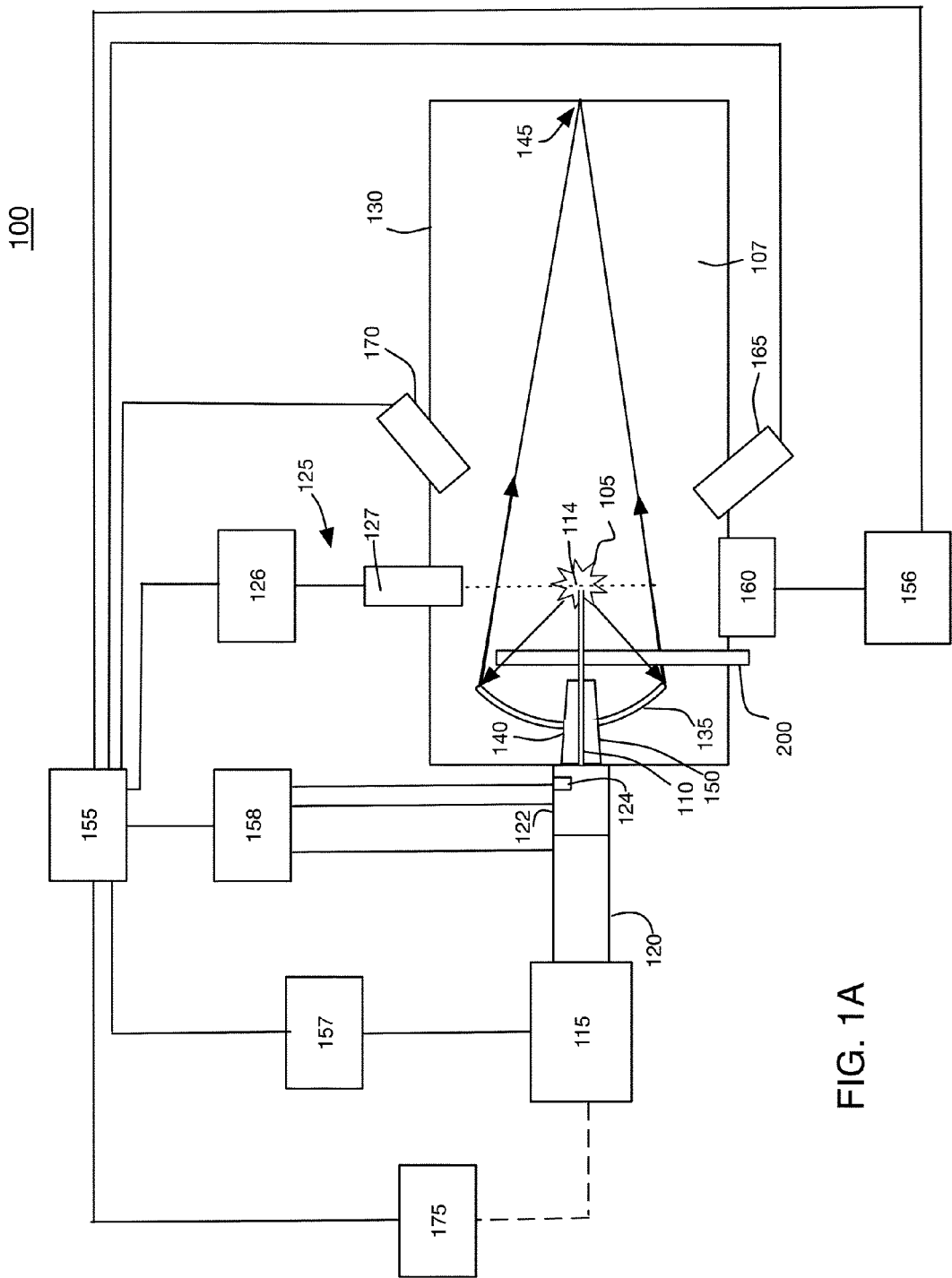
FIG. 1A is a block diagram of an exemplary laser produced plasma extreme ultraviolet light source.

Techniques for delivering free radicals (or radicals) to an element are disclosed. The free radicals combine with debris that collects on a surface of the element, thereby removing the debris from the surface and cleaning the element. The free radicals are delivered to the element with a free radical transport system that allows the element to be cleaned without removing it from its operating environment.

A free radical is an atom, molecule, or ion that has an unpaired valence electron or an open electron shell, and, therefore, may be seen as having a dangling covalent bond. The dangling bonds can make free radicals highly chemically reactive, that is, a free radical can react readily with other substances. Because of their reactive nature, free radicals can be used to remove a substance (such as debris) from an object. The free radicals can remove the debris by, for example, etching, reacting with, and/or combusting the debris.

In a laser produced plasma (LPP) extreme ultraviolet (EUV) light source, a target mixture is irradiated with an amplified light beam and converted to plasma that emits EUV light. The plasma production process can also produce debris in the form of particles, vapor residue, or pieces of matter that is in the target mixture. This debris can accumulate on the surfaces of objects in the path of the plasma. For example, the target mixture can include molten metal, such as tin, and tin particles can accumulate on a collector mirror that is in the path of the plasma.

The presence of the tin debris can reduce the performance of the collector mirror, thus, cleaning the mirror can be beneficial for system performance. However, the collector mirror (and/or other elements in the path of the plasma) is positioned inside of a vacuum chamber in a particular optical alignment. Removing the collector mirror from the EUV light source for cleaning can result in lost system time. The transport system disclosed herein delivers free radicals from the source of the free radicals to an element that is inside of the vacuum chamber. By delivering free radicals to the collector mirror, or other elements in the EUV light source that are affected by debris, the elements can be cleaned by exposure to free radicals without being removed from the EUV light source.

Free radicals can be produced by, for example, a microwave plasma generator. However, because free radicals can combine readily with many materials, particularly metals, transporting radicals from a point of generation to a location for cleaning that is inside of a larger system (such as an EUV light source), separate from the source of free radicals can be challenging.

As discussed below, by forming a transport system that is made from a material that does not readily combine with free radicals and has a geometry that allows the transport system to span a distance between the source and the element to be cleaned while also encouraging movement of free radicals, free radicals can be delivered from an external source of free radicals to an element to be cleaned without relocating the element to be cleaned to the location of the source of free radicals. That is, the element can be cleaned without being removed from its operating environment.

The EUV light source is discussed before discussing the free radical transport system.

Referring to FIG. 1A, an LPP EUV light source 100 is shown. The LPP EUV light source 100 includes a free radical transport system 200. The transport system 200 is shown as being part of the source 100. However, the transport system 200 can be removed from and reinserted into the source 100. The EUV light source 100 is discussed before discussing the free radical transport system 200. The free radical transport system 200 is discussed in greater detail beginning with FIG. 2A.

The LPP EUV light source 100 is formed by irradiating a target mixture 114 at a target location 105 with an amplified light beam 110 that travels along a beam path toward the target mixture 114. The target location 105, which is also referred to as the irradiation site, is within an interior 107 of a vacuum chamber 130. When the amplified light beam 110 strikes the target mixture 114, a target material within the target mixture 114 is converted into a plasma state that has an element with an emission line in the EUV range. The created plasma has certain characteristics that depend on the composition of the target material within the target mixture 114. These characteristics can include the wavelength of the EUV light produced by the plasma and the type and amount of debris released from the plasma.

The light source 100 also includes a target material delivery system 125 that delivers, controls, and directs the target mixture 114 in the form of liquid droplets, a liquid stream, solid particles or clusters, solid particles contained within liquid droplets or solid particles contained within a liquid stream. The target mixture 114 includes the target material such as, for example, water, tin, lithium, xenon, or any material that, when converted to a plasma state, has an emission line in the EUV range. For example, the element tin can be used as pure tin (Sn); as a tin compound, for example, $SnBr_4$, $SnBr_2$, $SnH_4$; as a tin alloy, for example, tin-gallium alloys, tin-indium alloys, tin-indium-gallium alloys, or any combination of these alloys. The target mixture 114 can also include impurities such as non-target particles. Thus, in the situation in which there are no impurities, the target mixture 114 is made up of only the target material. The target mixture 114 is delivered by the target material delivery system 125 into the interior 107 of the chamber 130 and to the target location 105.

The light source 100 includes a drive laser system 115 that produces the amplified light beam 110 due to a population inversion within the gain medium or mediums of the laser system 115. The light source 100 includes a beam delivery system between the laser system 115 and the target location 105, the beam delivery system including a beam transport system 120 and a focus assembly 122. The beam transport system 120 receives the amplified light beam 110 from the laser system 115, and steers and modifies the amplified light beam 110 as needed and outputs the amplified light beam 110 to the focus assembly 122. The focus assembly 122 receives the amplified light beam 110 and focuses the beam 110 to the target location 105.

In some implementations, the laser system 115 can include one or more optical amplifiers, lasers, and/or lamps for providing one or more main pulses and, in some cases, one or more pre-pulses. Each optical amplifier includes a gain medium capable of optically amplifying the desired wavelength at a high gain, an excitation source, and internal optics. The optical amplifier may or may not have laser mirrors or other feedback devices that form a laser cavity. Thus, the laser system 115 produces an amplified light beam 110 due to the population inversion in the gain media of the laser amplifiers even if there is no laser cavity. Moreover, the laser system 115 can produce an amplified light beam 110 that is a coherent laser beam if there is a laser cavity to provide enough feedback to the laser system 115. The term "amplified light beam" encompasses one or more of: light from the laser system 115 that is merely amplified but not necessarily a coherent laser oscillation and light from the laser system 115 that is amplified and is also a coherent laser oscillation.

The optical amplifiers in the laser system 115 can include as a gain medium a filling gas that includes $CO_2$ and can amplify light at a wavelength of between about 9100 and about 11000 nm, and in particular, at about 10600 nm, at a gain greater than or equal to 100. Suitable amplifiers and lasers for use in the laser system 115 can include a pulsed laser device, for example, a pulsed, gas-discharge $CO_2$ laser device producing radiation at about 9300 nm or about 10600 nm, for example, with DC or RF excitation, operating at relatively high power, for example, 10 kW or higher and high pulse repetition rate, for example, 40 kHz or more. The optical amplifiers in the laser system 115 can also include a cooling system such as water that can be used when operating the laser system 115 at higher powers.

Figure 1B:
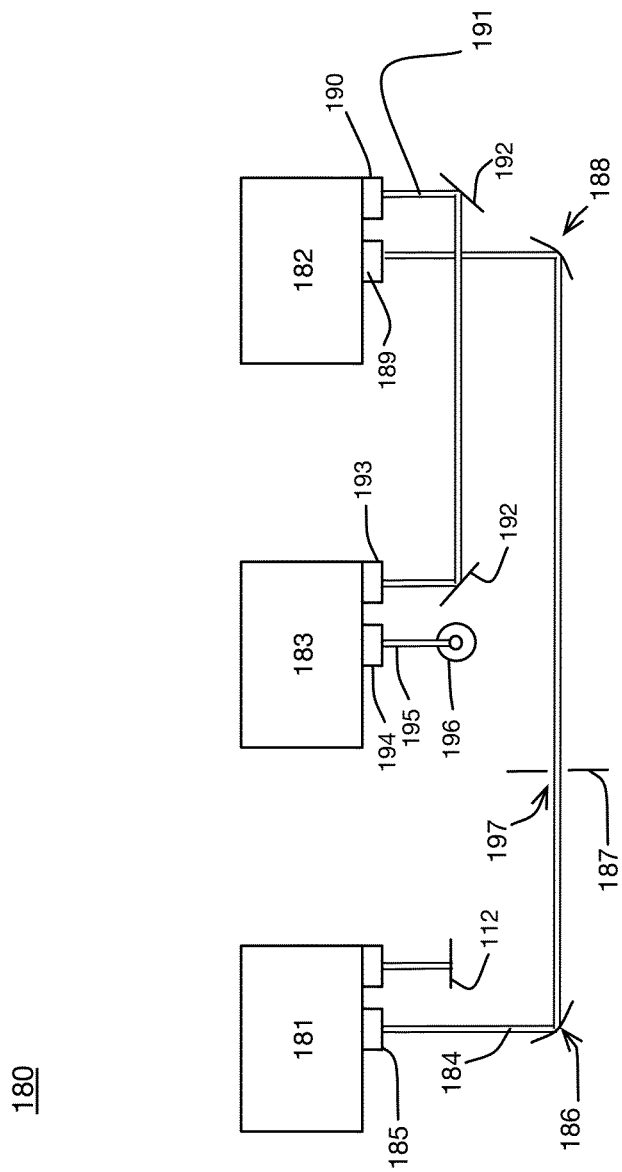
FIG. 1B is a block diagram of an example of a drive laser system that can be used in the light source of FIG. 1A.

FIG. 1B shows a block diagram of an example drive laser system 180. The drive laser system 180 can be used as the drive laser system 115 in the source 100. The drive laser system 180 includes three power amplifiers 181, 182, and 183. Any or all of the power amplifiers 181, 182, and 183 can include internal optical elements (not shown).

Light 184 exits from the power amplifier 181 through an output window 185 and is reflected off a curved mirror 186. After reflection, the light 184 passes through a spatial filter 187, is reflected off of a curved mirror 188, and enters the power amplifier 182 through an input window 189. The light 184 is amplified in the power amplifier 182 and redirected out of the power amplifier 182 through an output window 190 as light 191. The light 191 is directed toward the amplifier 183 with a fold mirror 192 and enters the amplifier 183 through an input window 193. The amplifier 183 amplifies the light 191 and directs the light 191 out of the amplifier 183 through an output window 194 as an output beam 195. A fold mirror 196 directs the output beam 195 upward (out of the page) and toward the beam transport system 120 (FIG. 1A).

Referring again to FIG. 1B, the spatial filter 187 defines an aperture 197, which can be, for example, a circle having a diameter between about 2.2 mm and 3 mm. The curved mirrors 186 and 188 can be, for example, off-axis parabola mirrors with focal lengths of about 1.7 m and 2.3 m, respectively. The spatial filter 187 can be positioned such that the aperture 197 coincides with a focal point of the drive laser system 180.

Referring again to FIG. 1A, the light source 100 includes a collector mirror 135 having an aperture 140 to allow the amplified light beam 110 to pass through and reach the target location 105. The collector mirror 135 can be, for example, an ellipsoidal mirror that has a primary focus at the target location 105 and a secondary focus at an intermediate location 145 (also called an intermediate focus) where the EUV light can be output from the light source 100 and can be input to, for example, an integrated circuit lithography tool (not shown). The light source 100 can also include an open-ended, hollow conical shroud 150 (for example, a gas cone) that tapers toward the target location 105 from the collector mirror 135 to reduce the amount of plasma-generated debris that enters the focus assembly 122 and/or the beam transport system 120 while allowing the amplified light beam 110 to reach the target location 105. For this purpose, a gas flow can be provided in the shroud that is directed toward the target location 105.

The light source 100 can also include a master controller 155 that is connected to a droplet position detection feedback system 156, a laser control system 157, and a beam control system 158. The light source 100 can include one or more target or droplet imagers 160 that provide an output indicative of the position of a droplet, for example, relative to the target location 105 and provide this output to the droplet position detection feedback system 156, which can, for example, compute a droplet position and trajectory from which a droplet position error can be computed either on a droplet by droplet basis or on average. The droplet position detection feedback system 156 thus provides the droplet position error as an input to the master controller 155. The master controller 155 can therefore provide a laser position, direction, and timing correction signal, for example, to the laser control system 157 that can be used, for example, to control the laser timing circuit and/or to the beam control system 158 to control an amplified light beam position and shaping of the beam transport system 120 to change the location and/or focal power of the beam focal spot within the chamber 130.

The target material delivery system 125 includes a target material delivery control system 126 that is operable, in response to a signal from the master controller 155, for example, to modify the release point of the droplets as released by a target material supply apparatus 127 to correct for errors in the droplets arriving at the desired target location 105.

Additionally, the light source 100 can include light source detectors 165 and 170 that measures one or more EUV light parameters, including but not limited to, pulse energy, energy distribution as a function of wavelength, energy within a particular band of wavelengths, energy outside of a particular band of wavelengths, and angular distribution of EUV intensity and/or average power. The light source detector 165 generates a feedback signal for use by the master controller 155. The feedback signal can be, for example, indicative of the errors in parameters such as the timing and focus of the laser pulses to properly intercept the droplets in the right place and time for effective and efficient EUV light production.

The light source 100 can also include a guide laser 175 that can be used to align various sections of the light source 100 or to assist in steering the amplified light beam 110 to the target location 105. In connection with the guide laser 175, the light source 100 includes a metrology system 124 that is placed within the focus assembly 122 to sample a portion of light from the guide laser 175 and the amplified light beam 110. In other implementations, the metrology system 124 is placed within the beam transport system 120. The metrology system 124 can include an optical element that samples or re-directs a subset of the light, such optical element being made out of any material that can withstand the powers of the guide laser beam and the amplified light beam 110. A beam analysis system is formed from the metrology system 124 and the master controller 155 since the master controller 155 analyzes the sampled light from the guide laser 175 and uses this information to adjust components within the focus assembly 122 through the beam control system 158.

Thus, in summary, the light source 100 produces an amplified light beam 110 that is directed along the beam path to irradiate the target mixture 114 at the target location 105 to convert the target material within the mixture 114 into plasma that emits light in the EUV range. The amplified light beam 110 operates at a particular wavelength (that is also referred to as a drive laser wavelength) that is determined based on the design and properties of the laser system 115. Additionally, the amplified light beam 110 can be a laser beam when the target material provides enough feedback back into the laser system 115 to produce coherent laser light or if the drive laser system 115 includes suitable optical feedback to form a laser cavity.

Figure 2A:
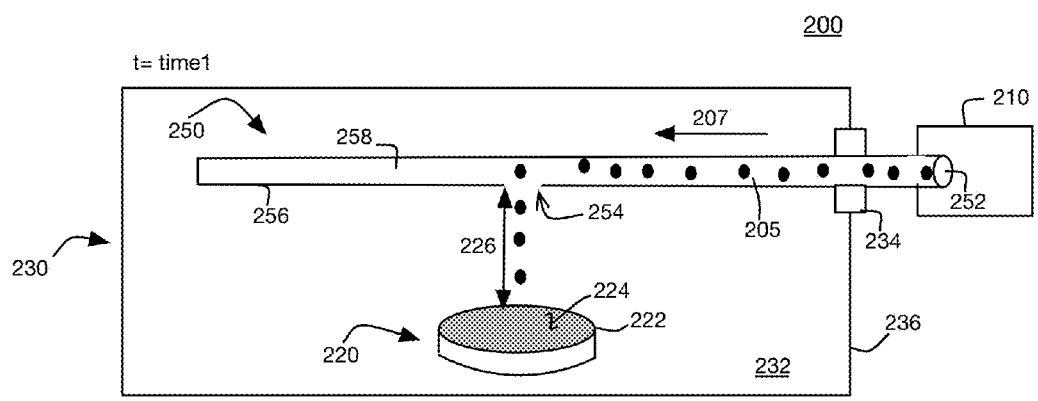
FIG. 2A-2C show a side view of an exemplary free radical transport system at three different times.
Figure 2B:
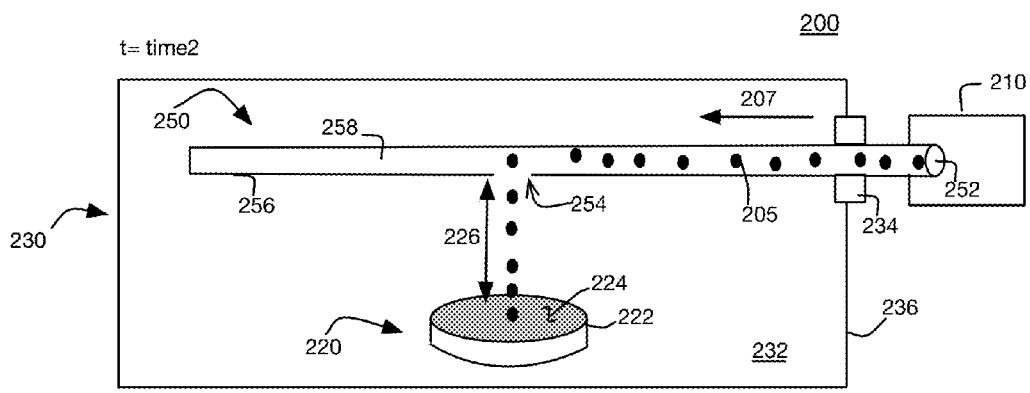
Figure 2C:
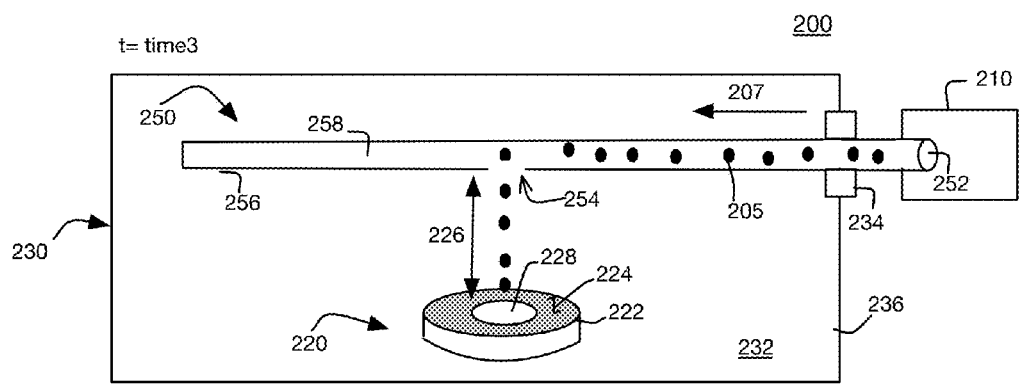

FIGS. 2A-2C show block diagrams of an exemplary free radical transport system 200 at three different times, time1 (t1), time2 (t2), and time3 (t3), respectively. Time t1 is the earliest time, with time t2 occurring after time t1, and time t3 occurring after time t2. The free radical transport system 200 delivers free radicals 205 to an element 220 that is inside of a vessel 230. The free radical transport system 200 is also shown in FIG. 1A.

The free radical transport system 200 includes a conduit 250 that connects to a source 210 of free radicals 205. The free radicals 205 flow into an opening 252 defined by the conduit 250 and travel in the conduit 250 along a direction 207. The conduit 250 also defines another opening 254 that passes through a sidewall 256 of the conduit 250 to provide a passage between an interior 258 of the conduit 250 and the interior 232 of the vessel 230. The vessel 230 can be a vacuum chamber, such as the vacuum chamber 130 discussed above. The element 220 can be any element that is exposed to debris that is generated in the interior 232 of the vessel 230. The element 220 can be an optical element that is in the path of plasma that is generated in the interior 232.

For example, the element 220 can be a collector mirror, such as the collector mirror 135 of FIG. 1A.

Referring to FIG. 2A, the free radicals 205 travel from a source 210 through the conduit 250 in the direction 207 and exit through the opening 254 into the interior 232. The opening 254 is positioned so that the radicals 205 flow to the element 220 after exiting through the opening 254. For example, the opening 254 can be positioned to face a surface 222 of the element 220. The opening 254 is positioned a distance 226 from the surface 222. The distance 226 can be, for example, 15 to 30 cm. In the example shown, the conduit 250 includes the one additional opening 254, however, in other implementations, such as those shown in FIGS. 3A-3C and 5-11, a plurality of openings are formed in the conduit.

The element 220 is located in an interior 232 of the vessel 230. The conduit 250 passes through a sealed opening or port 234 in a wall 236 of the vessel 230. Thus, the conduit 250 transports the free radicals 205 from the external source 210 to the element 220. The free radicals 205 exit the conduit 250 through the opening 254 and pass into the interior 232.

Referring to FIG. 2B, the radicals 205 reach debris 224 that is on the surface 222. Continuing the example of the element 220 being in the path of plasma that is generated in the interior 232, the debris 224 can be contamination that originates from vapors, ions, particles, and/or clusters formed from a target mixture used to generate the plasma. The target mixture can be any material that emits EUV light when converted to plasma. Thus, the debris 224 can include vapor residue, particles, ions, or clusters of metal, such as tin, lithium, or any other substance that, when converted to a plasma, emits EUV light. As shown in FIG. 2C, the radicals 205 recombine with the debris 224 to remove the debris 224 from the surface 222. The recombination creates a cleaned region 228 that is free of the debris 224. The cleaned region 228 can be a circular area having a diameter of, for example, 6 inches (15.24 cm) or greater.

The conduit 250 is made of a material that does not react or combine with the free radicals or one that has a low recombination coefficient (for example, a recombination coefficient of about $5 \times 10^{-3}$ or less). The recombination coefficient is a measure of a probability that a radical will recombine on or otherwise attach to material surface after a single collision with that surface. In the context of the free radicals 205 that travel through the conduit 250, the recombination coefficient of the material on an inner wall and the openings 252 and 254 determines, in part, the portion of radicals generated by the source 210 that reach the element 220. Materials that have a lower recombination coefficient allow a larger portion of the generated radicals 205 to reach the element 220 because relatively few of the free radicals 205 generated by the source 310 are lost by recombination through collisions with inner walls of the conduit 250.

The conduit 250 can be made of Teflon, quartz, or glass such as borosilicate glass (for example, Pyrex). In some implementations, the conduit 250 can be made of a metal that is coated, with a material that has a low recombination coefficient, at the portions that could come into contact with a free radical 205. For example, the conduit 250 can be an aluminum conduit having an interior surface and ends that are coated with glass, such as, for example, Pyrex. In another example, the conduit 250 can be made of an oxidized metal, such as silicon dioxide ($SiO_2$), titanium oxide ($TiO_2$), or aluminum oxide ($AlO_2$). As yet another example, the conduit can be made of an anodized metal, such as anodized aluminum. Although a conduit made from a metal oxide can have a higher recombination coefficient than one made from a non-metallic material, a metal conduit can be relatively easier to machine and can be more rugged.

The material of the conduit 250 and the mass flow rate of the radicals 205 through the conduit allow the conduit 250 to be long enough to deliver the radicals 205 to the element 220 in-situ, that is, while the element is inside of the vessel 230. For example, the conduit 250 can have a longitudinal extent along the direction 207 of 0.8-2 meters.

Figure 3A:
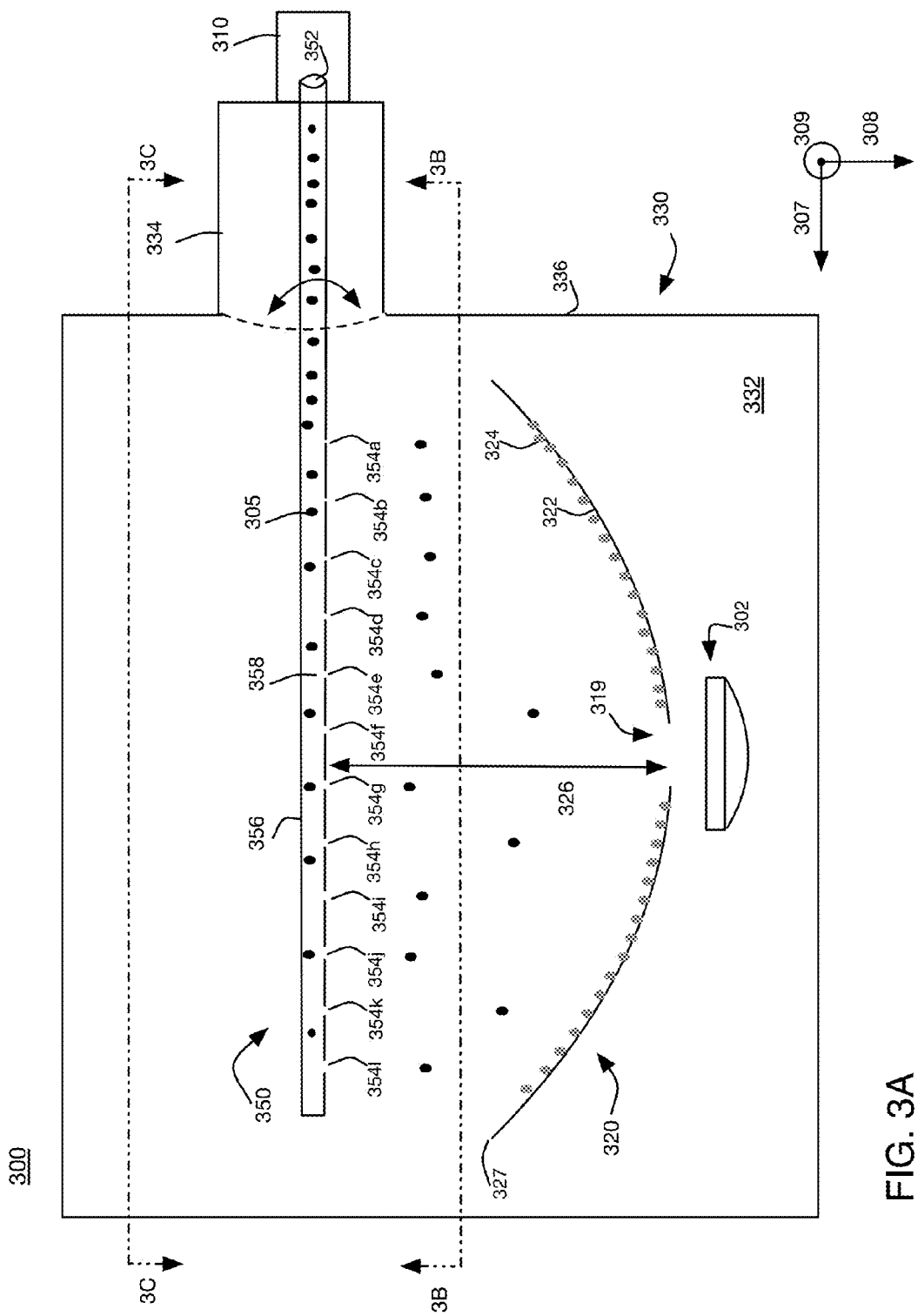
FIG. 3A shows a side view of a block diagram of another exemplary free radical transport system.
Figure 3B:
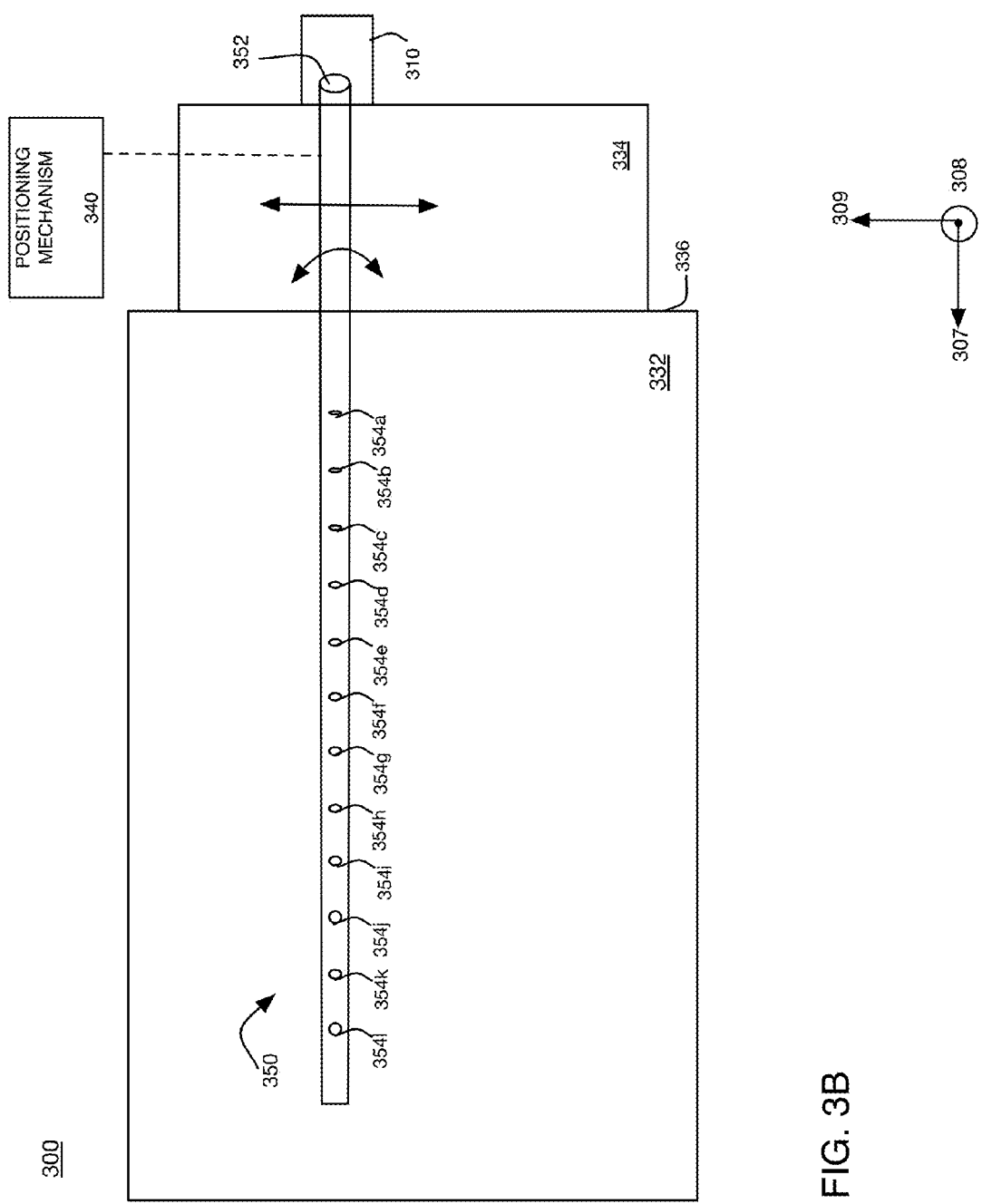
FIG. 3B shows a plan view of the system of FIG. 3A taken along line 3B-3B.
Figure 3C:
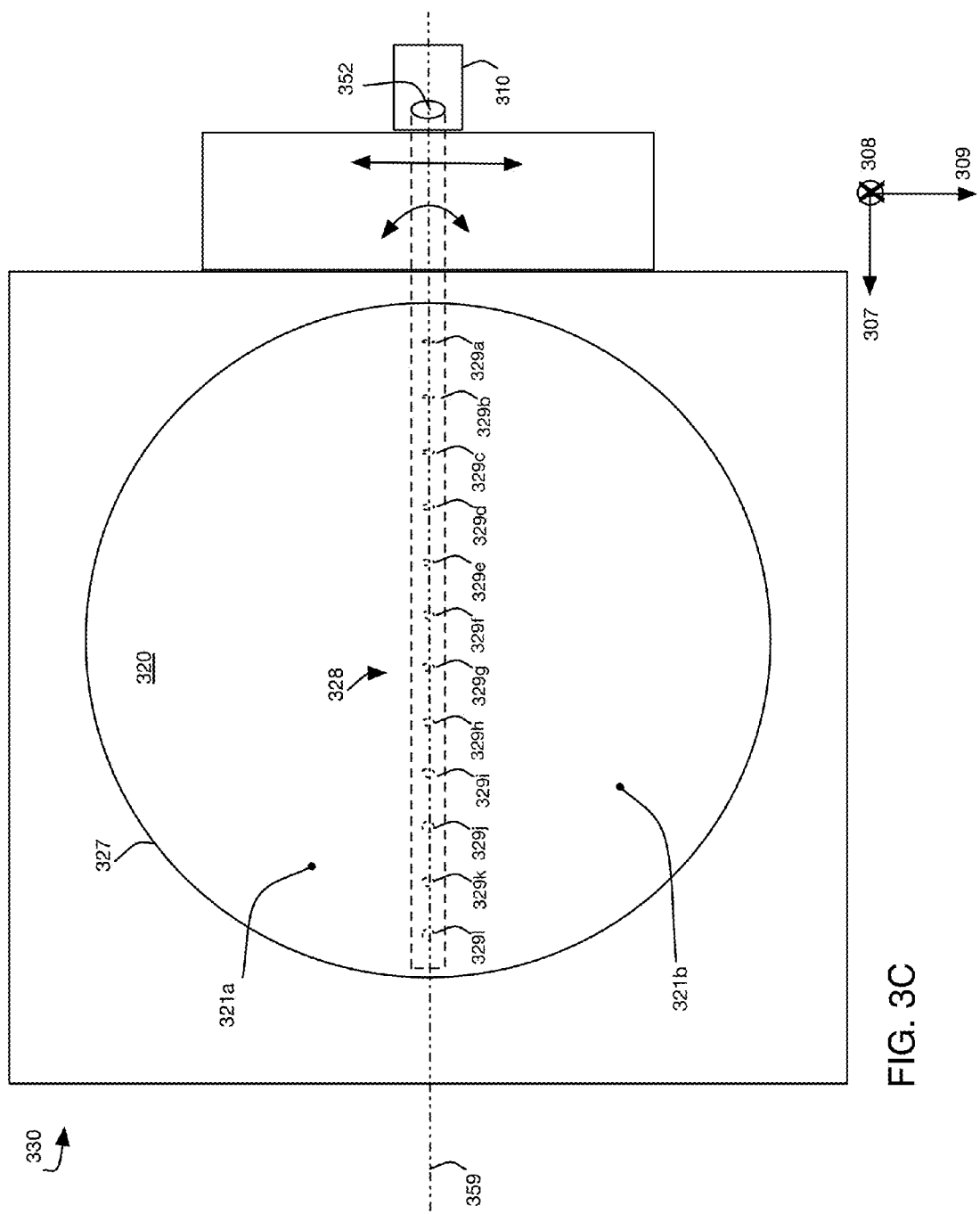
FIG. 3C shows a plan view of the system of FIG. 3A taken along line 3C-3C.

Referring to FIGS. 3A-3C, a block diagram of another exemplary free radical transport system 300 is shown. FIG. 3A shows a side view of the transport system 300, FIG. 3B shows a view of the transport system 300 taken along line 3B-3B of FIG. 3A, and FIG. 3C shows a view of the transport system 300 taken along line 3C-3C of FIG. 3A.

The free radical transport system 300 includes a conduit 350 that defines openings 354a-354l through which free radicals 305 exit the conduit 350 and are directed toward an element 320. The variable size and particular placement of the openings 354a-354l allows the system 300 to provide radicals to the element 320 at a uniform rate, thereby cleaning the element 320 at a uniform rate. The sizes of the openings 354a-354l increase in the direction 307, with the smallest opening (opening 354a) being closest to the source 310 and the largest opening (opening 354l) being farthest from the source 310.

Referring to FIG. 3A, the free radical transport system 300 includes a source 310 that produces the free radicals 305. FIG. 3A shows the conduit 350 from the side, with the openings 354a-354l oriented perpendicular to the direction 307, so that the free radicals 305 flow out of the openings 354a-354l in a direction 308 toward the element 320. The conduit 350 defines an opening 352 that couples to the source 310 and receives the generated free radicals 305. The conduit 350 passes through a sidewall 336 and a sealed port 334 of a vessel 330 (for example, a vacuum chamber) and into an interior 332 of the vessel 330. The free radicals 305 travel in a direction 307 in the conduit 350 and exit through the openings 354a-354l toward the element 320. The conduit 350 is located a distance 326 from the element 320. For an element, such as the element 320 that has a curved surface, that faces the conduit, the distance 326 is the largest distance from the conduit to the element. The distance 326 can be, for example, 15-30 cm.

The element 320 is in the interior 332 a vessel 330. The vessel 330 is part of an LLP EUV light source (such as the light source 100 of FIGS. 1A and 1B). The element 320 defines a surface 322 that is in the path of plasma that is generated in the vessel 330, and the plasma generation can cause debris 324 to form on the surface 322. The debris can include, for example, vapor residue, particles, and ions of a tin droplets that are part of the target mixture used to generate the plasma.

When the radicals 305 reach the debris 324, the radicals 305 combine with the debris 324, thereby removing the debris 324 from the surface 322. Because the conduit 350 delivers the free radicals 305 to the element 320, there is no need to remove the element 320 from the vessel 330 for cleaning. Instead, the element 320 is cleaned while residing inside of the vessel 330. Cleaning the element 320 without removal from the vessel 330 reduces system downtime because, for example, the element 320 is not disturbed and does not have to be realigned after cleaning.

Referring also to FIGS. 3B and 3C, the conduit 350 includes openings 354a-354l, each of which forms a passage through a wall 356 of the conduit 350. FIG. 3B shows a view of the conduit 350 looking upward at the conduit 350 from the element 320, in a direction that is opposite to the direction 308. FIG. 3C shows a view looking downward onto the element 320, with the direction 308 going into the page. FIG. 3C also shows projections 329a-329l of each of the openings 354a-354l, respectively, on the surface 322 of the element 320. Together, the projections 329a-329l define a swath 328, which is the portion of the element 320 that is exposed to the free radicals 305 emitted from the openings 354a-354l.

The sizes of the openings 354a-354l increase in the direction 307, with the smallest opening (opening 354a) being closest to the source 310 and the largest opening (opening 354l) being farthest from the source 310. As discussed below, the increasing size of the openings 354a-354l in the direction 307 causes the free radicals 305 reach the swath 328 at a uniform rate.

The source 310 can be a microwave plasma generator. To produce free radicals with such a source, a gas from which the free radicals are formed is provided to the source 310. For example, to produce hydrogen radicals, hydrogen gas ($H_2$) is provided. An additional gas can be added to the gas prior to providing the gas to the source 310. For example, a mixture of argon and oxygen ($Ar/O_2$) can be added to the hydrogen gas. Both the hydrogen gas and the additional gas mixture have a mass flow rate and velocity when provided to the source 310. For example, the hydrogen gas can be provided to the source 310 at a mass flow rate of 3 standard liters per minute (SLM), and the $Ar/O_2$ mixture can be provided to the source at a mass flow rate of 21 standard cubic centimeters per minute (SCCM).

The hydrogen and $Ar/O_2$ gasses enter the source 310, are used to produce hydrogen free radicals and a moving gas that passes into the conduit 350 in the direction 307. The moving gas that travels in the conduit gives rise to a back pressure that acts along a direction opposite from the direction 307. The back pressure is a resistance that is encountered by the moving gas as it flows through the conduit 350.

When present, back pressure has the effect of reducing the mass flow rate or velocity of the gas that travels in the conduit 350, which, in turn, causes the free radicals carried by the gas to stay in the conduit 350 for a longer period of time. The time that the free radicals 305 are in the conduit 350 is the "residence time." The presence of back pressure can result in a higher residence time for the hydrogen radicals, and the higher residence time leads to more opportunities for the radicals to recombine with the interior walls of the conduit 350 and fewer hydrogen radicals reaching the element 320.

Increasing the mass flow rate or velocity of the gas flowing in the conduit 350 in the direction 307 can also increase the speed at which the free radicals 305 travel in the conduit 350 quickly, thereby delivering the free radicals to the element 320 at a higher rate and cleaning the element 320 more quickly. However, increasing the mass flow rate or velocity of the flowing gas also can increase the back pressure, which can lower the amount of free radicals delivered to the element 320 (through increased recombination during the radicals' increased residence time in the conduit) and can also lower the speed at which the radicals are delivered to the element 320 (through the reduced velocity of the flowing gas caused by the back pressure). As such, increases in the mass flow rate or velocity of the gas flowing in the conduit 350 are balanced against the creation of back pressure.

Additionally, in a conduit that lacks openings in a sidewall, the pressure or resistance encountered by gas flowing in the conduit can increase in the direction of gas flow. If the openings in the sidewalls are all the same size, more radicals 305 exit from the opening closest to the source than any other opening because the pressure inside the conduit 350 is increased towards the source 310. Further, in this situation, the radicals 305 decrease in velocity as they move through the conduit 350 in the direction 307 because of the reducing or decreasing mass flow in the direction 307. As a result, if all of the openings in the conduit sidewall are the same size, radicals 305 reach the swath 328, but the velocity of the radicals 305 reaching the swath 328 may not be constant throughout the various portions of the swath 328.

In contrast, the openings 354a-354l of the conduit 350 have different sizes, and the sizes of the openings increase in the direction of the gas flow (the direction 307). This arrangement reduces the effect discussed above. Thus, when a conduit that has variable sized openings in a sidewall, such as the conduit 350, is used to deliver the radicals 305 to the surface 322, all of the portions of the swath 328 are cleaned at the same rate.

In some implementations, the backpressure in the conduit is kept below 0.9-1.2 torr, and the centerline mass flow of the flowing gas in the direction 307 is between 1-4 SLM. The etch rate or rate of removal of the debris 324 can be, for example, 5-125 nanometers per minute (nm/min). The rate of removal can be greater than 125 nm/min.

The openings 354a-354l can have circular cross sections with diameters of 4.5-6.5 mm and can be spaced equidistant from each other on the conduit 350 in the direction 307. The longitudinal spacing between each of the openings along the direction 307 can be, for example, 40 mm. Although the example shown in FIGS. 3A-3C includes twelve openings, in other examples, more or fewer openings can be used. For example, the conduit 350 can define ten openings or more than twelve openings.

Referring to FIGS. 3B and 3C, to enlarge the area on the element 320 that is cleaned, the conduit 350 can be rotated about a longitudinal axis 359 that is defined by the conduit 350 and extends along a direction that is parallel to the direction 307. Alternatively or additionally, the conduit 350 can be translated back and forth along a direction 309. The system 300 includes a positioning mechanism 340 that allows a user of the system 300 to move the conduit 350. The positioning mechanism 340 can be configured for manual operation, for example, with a lever, wheel, or other mechanical device that is accessible from outside of the vessel 330 and allows the user to move the conduit 350. The positioning mechanism 340 can be computer controlled. For example, the conduit 350 can be coupled to a stepper motor or other device that moves the conduit 350 when activated by a user or an automated electronic process.

Translation of the conduit 350 back and forth along the direction 309 moves the conduit 350 relative to the element 320 while keeping the distance 326 (FIG. 3A) constant. In other words, the conduit 350 moves relative to the element 320 in a plane that is parallel to a plane that includes a perimeter or edge 327 of the element 320. Rotating the conduit 350 about the axis 359 allows the free radicals 305 to be delivered to regions of the element 320 that are outside of the swath 328, such as the regions 321a and 321b. Translating the conduit 350 back and forth along the direction 309 also allows free radicals 305 to be delivered to regions of the element 320 that are outside of the swath 328.

Figure 4:
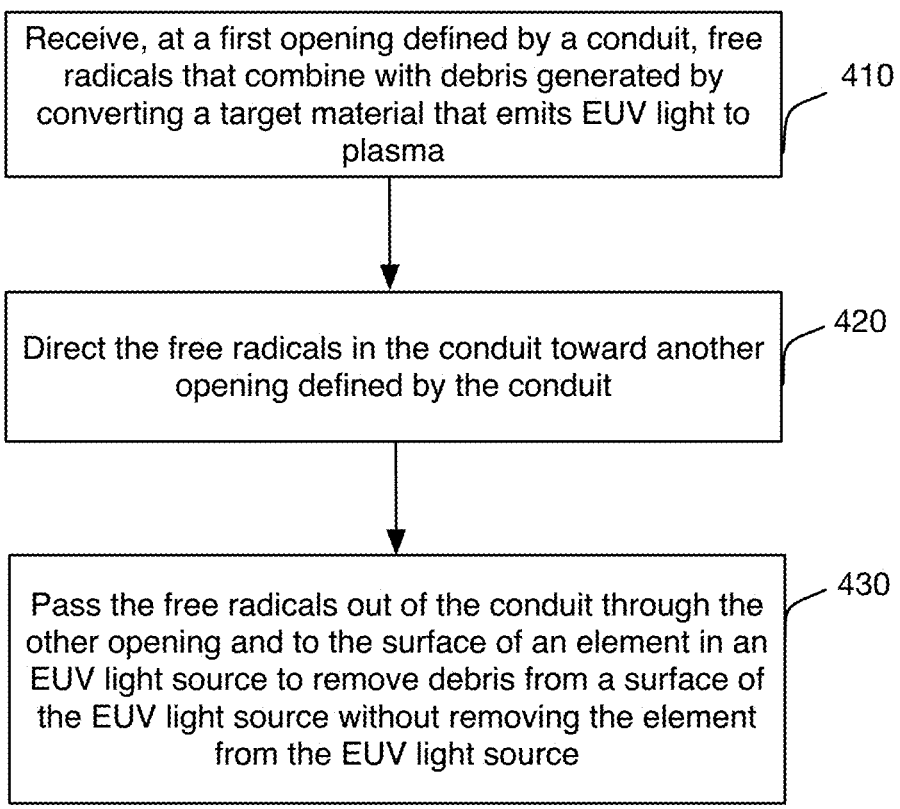
FIG. 4 is a flow chart of an exemplary process for cleaning an element that is inside of a vacuum chamber.

Referring to FIG. 4, a flow chart of an exemplary process 400 for cleaning an optical element in a vacuum chamber of an EUV light source without removing the element from the vacuum chamber is shown. The process 400 can be performed with any free radical transport system disclosed herein. For example, the process 400 can be performed with the transport system 200 or 300. In the discussion of the process 400, the system 300 is used as an example.

Referring again to FIGS. 3A-3C, free radicals 305 are received at the first opening 352 defined by the conduit 350 (410). The free radicals combine with debris on an element to be cleaned. The debris can be generated when a target mixture is converted to plasma that emits EUV light, and the debris can accumulate on a surface of the element by virtue of the element being in the path of the plasma. The free radicals 305 are generated by the source 310. The source 310 can be, for example, a microwave plasma generator, such as the SMART POWER GENERATOR available from MKS Instruments, Inc. of Andover, Mass. The source can be operated at, for example, 3000 Watts.

To generate the free radicals, a gas that is capable of being dissociated into free radicals is provided to the source 310. The gas can be or include, for example, hydrogen ($H_2$), hydrogen iodide (HI), bromine ($Br_2$), chlorine ($Cl_2$), iodine, ($I_2$), methane, or water. An additional gas (such as a mixture of argon and oxygen) can be added before providing the mixture to the source 310. The gas is provided to the source 310 at a mass flow rate or velocity, and the free radicals generated at the source 310 flow into the conduit 350 with a gas flow from the source 310.

The opening 352 and the portions of the conduit 350 that transport or are otherwise in the path of the free radicals 305 are made from a material that has a low recombination coefficient. The opening 352 is coupled to an applicator of the microwave plasma generator so that the opening 352 receives the free radicals 305. The applicator of the microwave plasma generator can be made of sapphire, and the conduit 350 and the opening 352 can couple to the sapphire applicator so that the free radicals do not encounter any metal surfaces while flowing from the source 310 into the conduit 350. Such an arrangement can help reduce radical loss at the coupling.

The free radicals 305 in the conduit 350 are directed toward the openings 354a-354l (420). The free radicals 305 can be directed toward the openings 354a-354l by the gas that flows from the source 310 in the conduit 350. Additionally or alternatively, the pressure in the interior 332 of the vessel 330, which is where the openings 354a-354l provide a passage to, is lower than the pressure at the source 310 and in the conduit 350. For example, the pressure in the inside of the vessel 330 can be 300 mtorr (40 pascals). As a result, the free radicals 305 are drawn from the conduit 350, through the openings 354a-354l, and into the interior 332.

As discussed above, to help promote transport of the radicals, the conduit 350 is made from a material that has a low recombination rate with the free radicals that flow into the conduit 350. Additionally, the mass flow rate or velocity of the gas that carries the radicals in the conduit is increased as much as possible while minimizing the effects of back pressure. Increasing the velocity at which the free radicals 305 move in the conduit 350 also reduces the amount of time the free radicals 305 are in the conduit 350, lessening the amount of radical loss that is attributable to collisions with the interior walls of the conduit 350. Increasing the velocity of the free radicals 305 also increases the rate of cleaning of the element. In some implementations, the free radicals 305 travel in the conduit 350 at a constant mass flow rate of 1-4 SLM over the longitudinal extent of the conduit 350. The longitudinal extent of the conduit 350 can be, for example, 0.8-2 meters.

The free radicals 305 are passed through at least one of the openings 354a-354l and toward the surface 322 of the element 320 (430). As discussed above a pressure differential between the interior 332 of the vessel 330, the source 310, and the interior of the conduit 350, with the pressure being lowest in the vessel 330, can cause the free radicals 305 to pass through the openings 354a-354l. The openings 354a-354l are oriented towards the swath 328 and direct the free radicals 305 to the swath 328. The radicals 305 combine with debris 324 on the swath 328 and remove the debris 324. The radical can combine with the debris by, for example, etching, combusting, or reacting with the debris 324. The radicals 305 can remove the debris at a rate of 5-125 nm/min.

In some implementations, such as shown in FIGS. 3B and 3C, the openings 354a-354l can be oriented toward the element 320 by rotating and/or translating the conduit 350 so that the openings 354a-354l are pointed toward a particular part of the element 320.

FIGS. 5-8 show other exemplary conduits 550-850, respectively. Any of the conduits can be used in the transport system 200 or 300.

Figure 5:
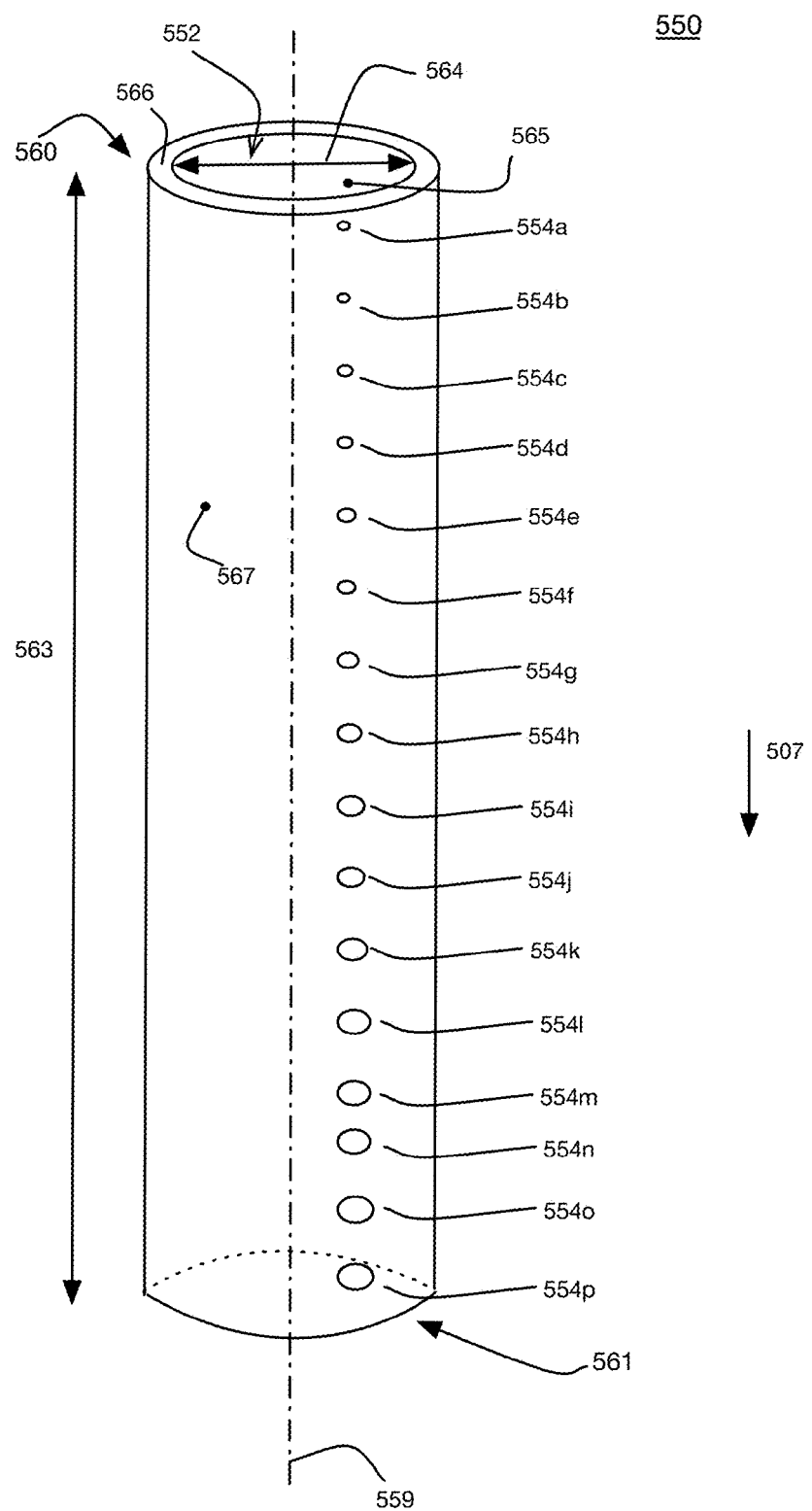
FIGS. 5-7 and 8A show perspective views of exemplary conduits for transporting free radicals.

Referring to FIG. 5, an exemplary conduit 550 is shown. The conduit 550 defines a longitudinal axis 559 and two ends, a source end 560 and a vessel end 561. The conduit 550 has a longitudinal extent 563 that is the distance between the source end 560 and the vessel end 561 in a direction that is parallel to the longitudinal axis 559. The extent 563 can be 0.8-2 m. For example, the extent 563 can be 0.8 m, 0.9 m, 0.95 m, 0.975 m, or 1 m. The conduit 550 has a wall 567 that defines an outer surface 556, an inner surface 565, and a rim 566. The rim 566 of the source end defines an opening 552 that has a diameter of 564. The diameter 564 can be, for example 2.5 cm.

The wall 567 defines openings 554a-554p, each of which pass through the wall 567 to form a passage that allows fluid and free radicals to pass from an interior of the conduit 550 to an exterior of the conduit 550. The size of the openings 554a-554p can vary, with the size increasing along the direction 507. That is, the opening 554a is the smallest opening, and the opening 554p is the largest opening. The openings 554a-554p can be circular in cross section, and can have diameters ranging between 4.5-6.5 mm. The openings can be spaced from each other 20-40 mm in the direction 507. Further, the conduit 550 can have more or fewer openings than the example shown in FIG. 5.

The rim 566 and the inner surface 565 are made from and/or coated with a material that has a low recombination coefficient. The rim 566 and the inner surface 565 can be or be coated with, for example, Pyrex, quartz, glass, a native oxide (such as silicon dioxide or titanium dioxide), or an anodized metal, such as anodized aluminum. The rim 566 and the inner surface 565 can be any material that has a recombination coefficient of about $5\times10^{-3}$ or less. In this manner, the rim 566 and the inner surface 565 recombine with relatively few free radicals, instead transporting the free radicals through the conduit and delivering the free radicals to an element to be cleaned. In other cases, material with a recombination coefficient of $1\times10'$ or higher can also be used with a corresponding decrease in the cleaning rate.

In use, the source end 560 is coupled to a source of free radicals and receives free radicals at the opening 552. For example, the source end 560 can be coupled to an applicator of a microwave plasma generator. The applicator of a microwave plasma generator is an element that converts microwave energy to plasma. The applicator of a microwave plasma generator can be a tube that is made of, for example, sapphire. Coupling the sapphire applicator tube to the opening 552 allows the free radicals generated by the source to flow into the conduit 550 without encountering metal or other elements that recombine with the free radicals. As a result, the coupling of the conduit 550 to the source results in the loss of few, if any, free radicals. The free radicals travel into the conduit 550 from the source and exit the conduit through the holes 554a-554p.

Figure 6:
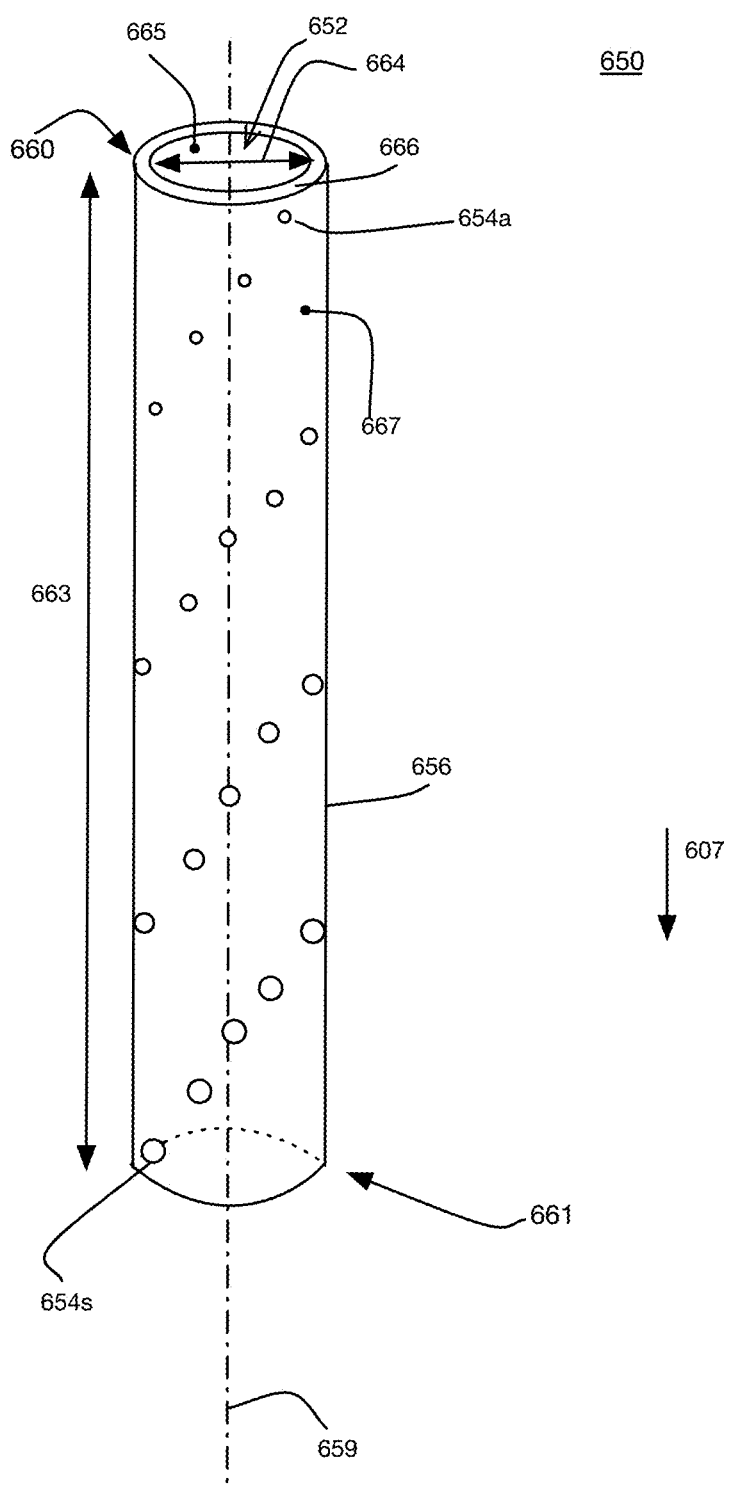
Figure 7:
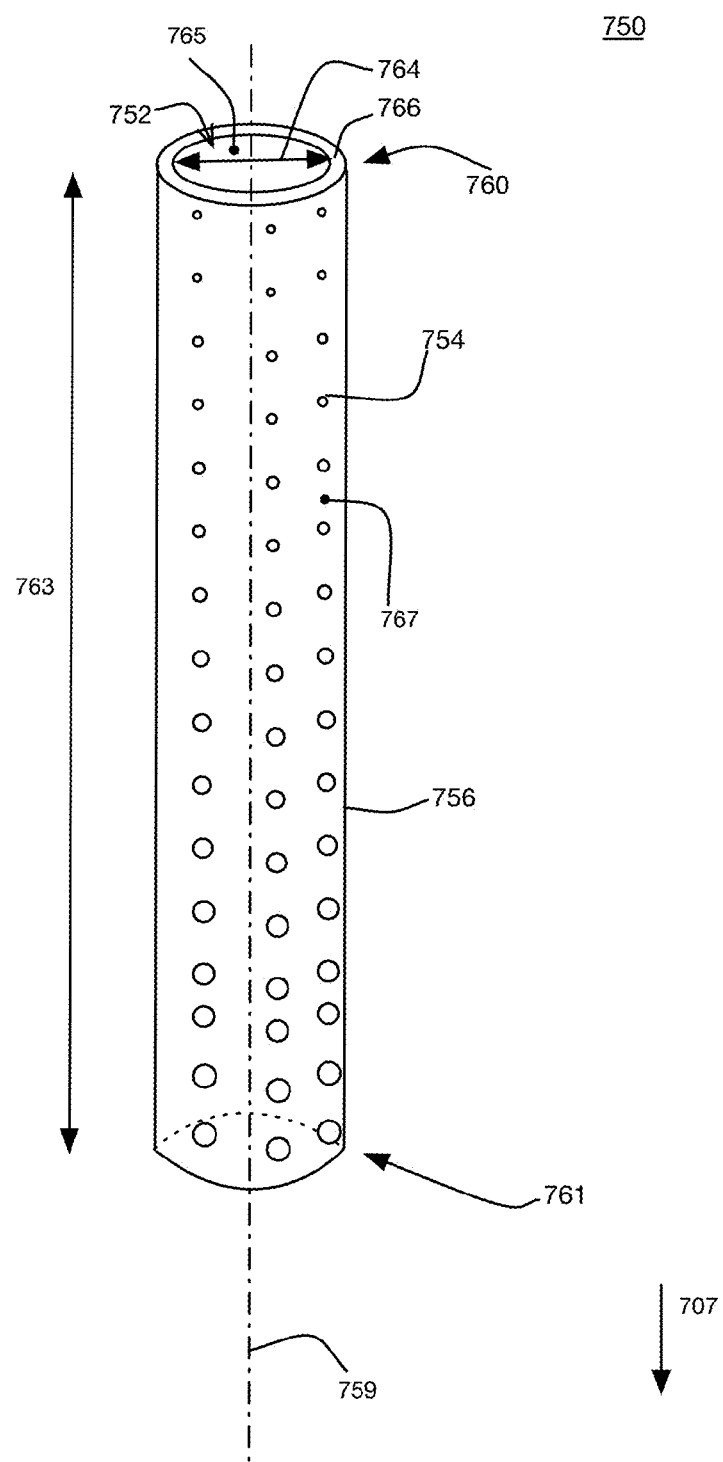

FIGS. 6 and 7 show other exemplary conduits 650 and 750, respectively. The conduits 650 and 750 can be used in any of the transport systems disclosed herein, for example the system 200 or 300 discussed above. The conduits 650 and 750 are similar to the conduit 550, except the conduits 650 and 750 have openings that are offset at different angles by being positioned to pass through different points on a sidewall 667, 767 of the conduit 650, 750. The positioning causes the radicals that are emitted from the conduits 650 and 750 to be emitted over a larger area of the element to be cleaned. In other words, when projected on to the element to be cleaned, the openings of the conduits 650 and 750 cover a larger area than the openings of a conduit that has openings that are all oriented at the same angle relative to the element to be cleaned. An example of such a conduit is one in which all of the openings are aligned along a line that is parallel to a longitudinal axis of the conduit (such as the conduit 550).

Referring to FIG. 6, the conduit 650 has a source end 660 and a vessel end 661. The conduit 650 has a wall 667 that defines a longitudinal axis 659, an outer surface 656, an inner surface 665, and a rim 666. The rim 666 of the source end 660 defines an opening 652 that has a diameter of 664. The diameter 664 can be, for example 2.5 cm. The wall also defines openings 654a-654s. The openings 654a-654s are arranged in a spiral arrangement on the wall 657. The openings 654a-654s can be arranged on only one half of the conduit, as shown in FIG. 6. In other implementations, the openings 654a-654s can be arranged on the surface of the entire conduit 650, so that radicals are emitted from the conduit 650 in all directions.

The conduit 650 has an extent 663 in a direction that is parallel to the longitudinal axis 659. The extent 663 can be 0.8-2 m. For example, the extent 663 can be 0.8 m, 0.9 m, 0.95 m, 0.975 m, or 1 m. Similar to the conduit 550, the inner surface 665 and the rim 666 of the conduit 650 are a material that has a low recombination coefficient.

Referring to FIG. 7, the conduit 750 has a source end 760 and a vessel end 761. The conduit 750 has a wall 767 that defines a longitudinal axis 759, an outer surface 756, an inner surface 765, and a rim 766. The rim 766 of the source end 760 defines an opening 752 that has a diameter of 764. The diameter 764 can be, for example 2.5 cm. The wall also defines a plurality of openings 754, each of which provides a passage between the interior and exterior of the conduit 650 for radicals and gas. The openings 754 are arranged in columns that extend parallel to the longitudinal axis 759. The openings 754 have different sizes, with the sizes increasing in the direction 707. The example conduit 750 shown in FIG. 7 has three columns of openings. However, more or fewer columns of openings can be used.

The conduit 750 has an extent 763 in a direction that is parallel to the longitudinal axis 759. The extent 763 can be 0.8-2 m. For example, the extent 763 can be 0.8 m, 0.9 m, 0.95 m, 0.975 m, or 1 m. Similar to the conduit 550, the inner surface 765 and the rim 766 of the conduit 750 are a material that has a low recombination coefficient.

Figure 8A:
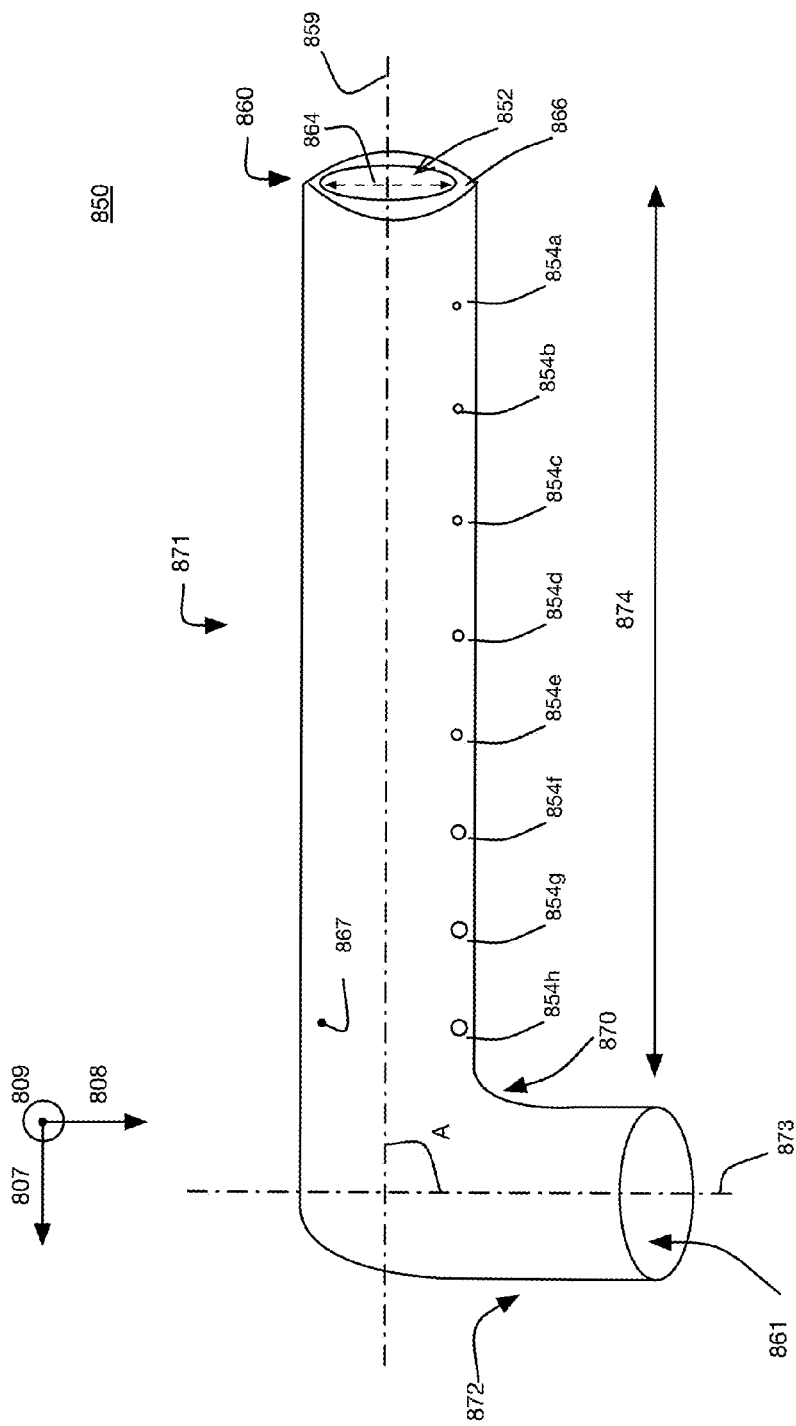
Figure 8B:
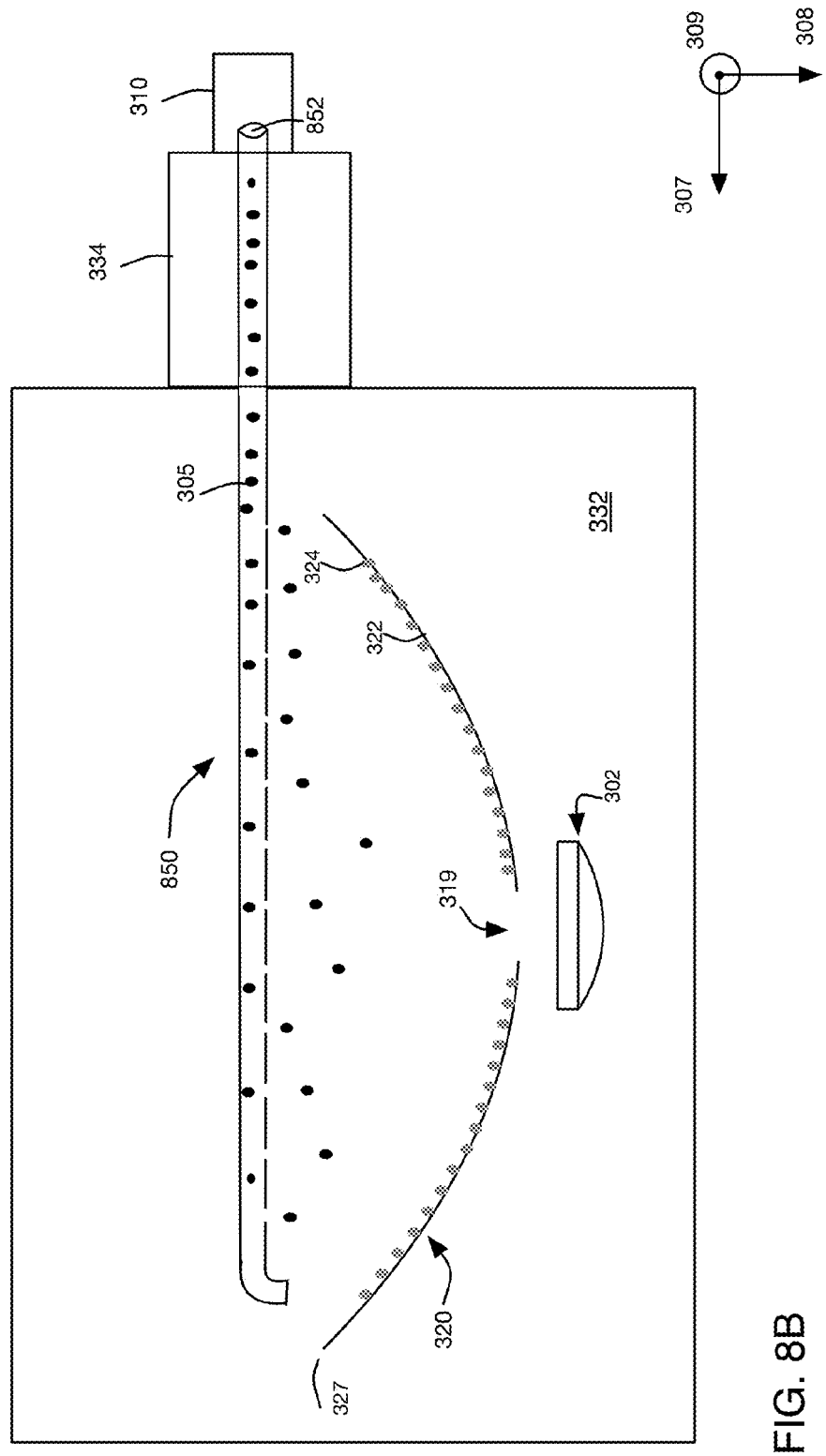
FIG. 8B shows a side view of another exemplary free radical transport system.

Referring to FIG. 8A, another exemplary conduit 850 is shown. The conduit 850 can be used as a conduit in any of the transport systems disclosed herein. For example, and referring also to FIG. 8B, the conduit 850 can be used in place of the conduit 350 in the transport system 300. The conduit 850 is similar to the conduit 550, except the conduit 850 has a radius of curvature 870. Because of the radius of curvature, the conduit 850 has a linear portion 871 that defines a longitudinal axis 859, and a curved portion 872 that bends away from the linear portion 871 and extends along an axis 873. The radius of curvature 870 can be any curvature such that the angle "A" between the longitudinal axis 859 and the axis 873 is greater than 0° and no more than 90°.

The conduit 850 includes a source end 860 and a vessel end 861. The conduit has an extent 874 along a direction 807 that is parallel to the longitudinal axis 859. The extent 874 can be 0.8 m, 0.9 m, 0.95 m, 0.975 m, or 1 m.

The conduit 850 has a wall 867 that defines a longitudinal axis 859, an outer surface 856, an inner surface 865, and a rim 866. The rim 866 of the source end 860 defines an opening 852 that has a diameter of 864. The diameter 864 can be, for example 2.5 cm. The wall also defines a plurality of openings 854, each of which provides a passage between the interior and exterior of the conduit 850 for radicals and gas. The openings 854 have different sizes, with the sizes increasing in the direction 807.

Similar to the conduit 550, the inner surface 865 and the rim 866 of the conduit 850 are a material that has a low recombination coefficient.

Figure 9A:
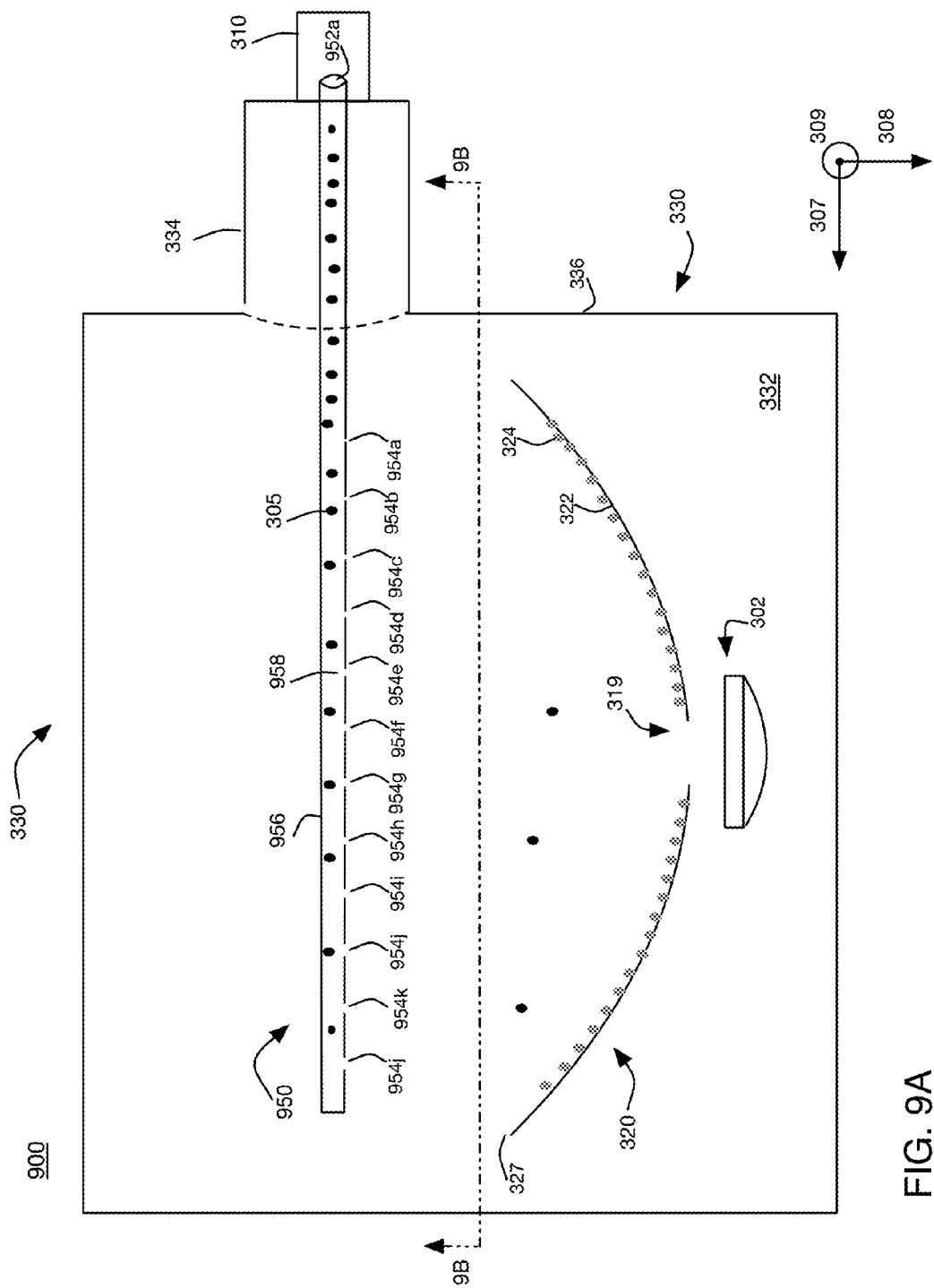
FIG. 9A shows a side view of another exemplary free radical transport system.
Figure 9B:
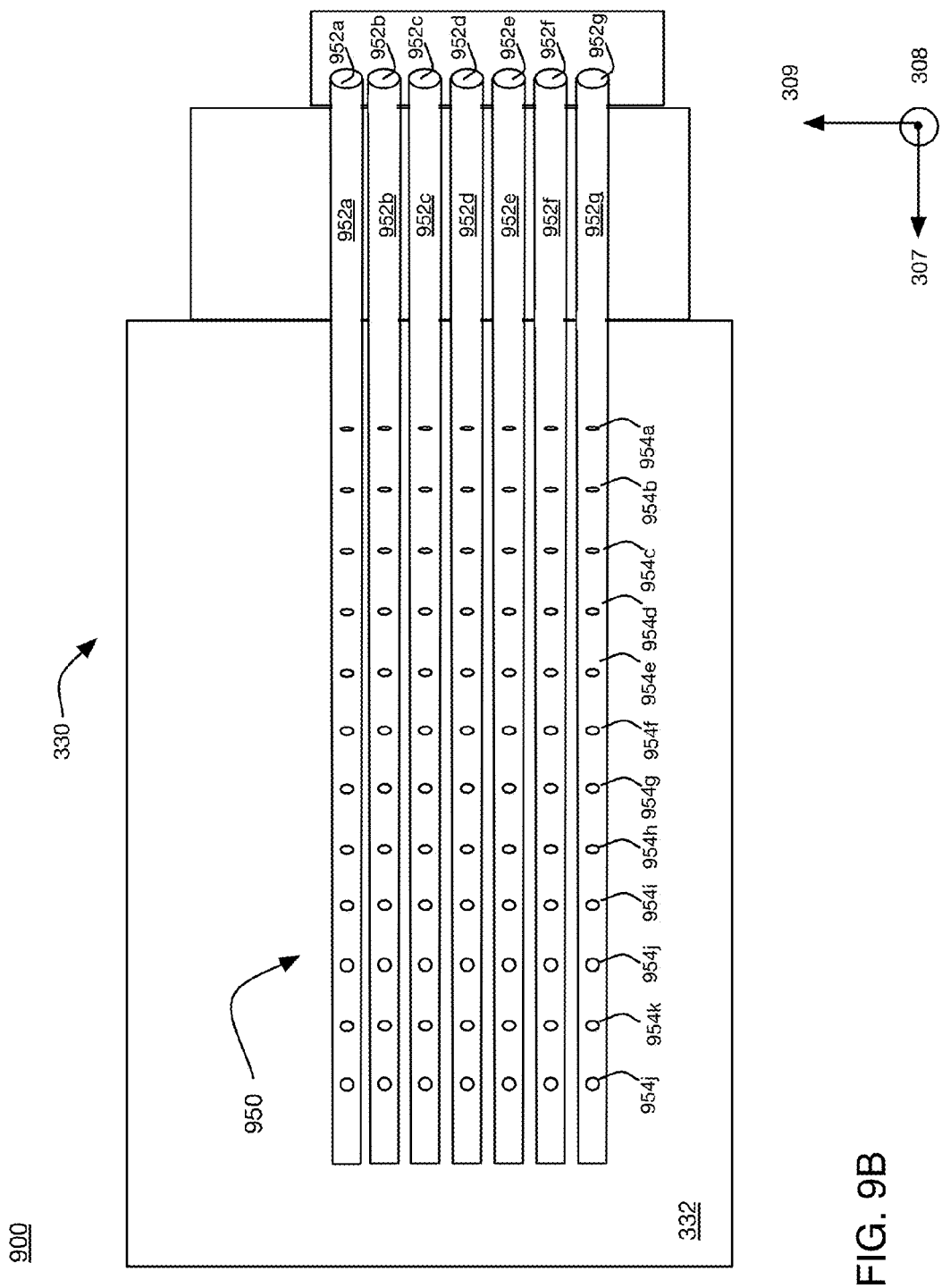
FIG. 9B shows a plan view of the system of FIG. 9A taken along line 9B-9B.

Referring to FIGS. 9A and 9B, a block diagram of another exemplary free radical transport system 900 is shown. FIG. 9A shows a side view of the transport system 900. FIG. 9B shows a cross-sectional view of the transport system 900 taken along the line 9B-9B of FIG. 9A. The transport system 900 includes a manifold 950 (FIG. 9B) that includes a plurality of conduits 950a-950g. The plurality of conduits 950a-950g is connected to a source of free radicals 905. In some implementations, each conduit 950a-950g is connected to a separate source of free radicals. The source 910 produces free radicals 905 that enter the conduits 950a-950g at openings 952a-952g, respectively, and flow in the conduits 950a-950g in a direction 907.

Each of the conduits 950a-950g has openings 954a-954l, all of which form a passage through a wall of the conduit and release free radicals 905 toward the element 920. Thus, as compared to a transport system that includes a single conduit, the transport system 900 can clean a larger area of an element 920 without having to rotate or translate the manifold 950. However, in some implementations, the manifold 950 can be rotated or translated to further increase the size of the region that is cleaned by the free radicals 905.

Further, in the conduits 950a-950g, the openings 954a-954l are each of a different size, with the sizes increasing in the direction 907. This is similar to the openings 354a-354l of conduit 350 that are discussed above a with respect to FIGS. 3A-3C. As such, the conduits 950a-950g deliver the free radicals 905 to the element 920 at a uniform rate, which results in debris being cleaned from the element 920 at a uniform rate. In other implementations, the openings 954a-954l can all be the same size. Although the manifold 950 includes seven (7) conduits, more or fewer conduits can be used. Additionally, the conduits of the manifold can include more or fewer openings than shown, and the conduits can include different numbers of openings.

Figure 10A:
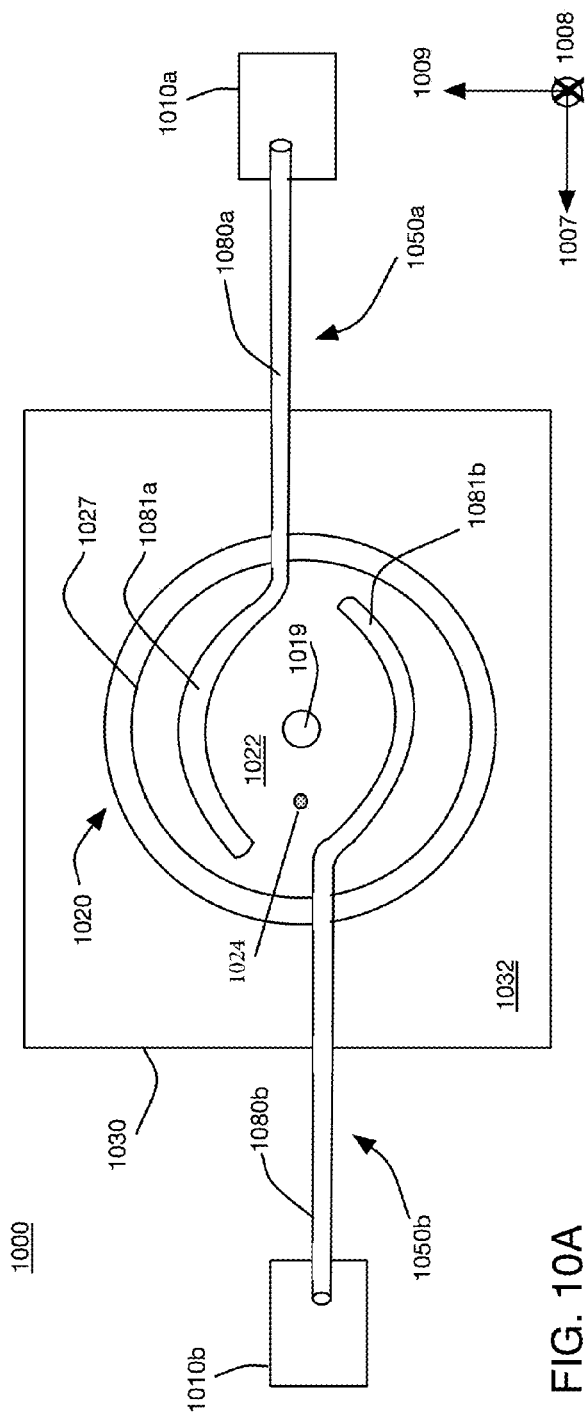
FIG. 10A shows a plan view of another exemplary free radical transport system.

Referring to FIG. 10A, a block diagram of another exemplary free radical transport system 1000 is shown. The view of the transport system 1000 is downward toward an element 1020 to be cleaned. The transport system 1000 is part of an LPP EUV light source, such as the source 100 of FIG. 1A, and the element 1020 is in the interior 1032 of a vessel 1030.

The transport system 1000 includes conduits 1050a, 1050b, each of which connects to a source of free radicals 1010a, 1010b, respectively. Free radicals from the sources 1010a, 1010b flow into the conduits 1050a, 1050b. Similar to the conduit 550 discussed above, the conduits 1050a, 1050b are made from a material that has a low recombination rate.

The element 1020 defines a surface 1022 that accumulates debris 1024 by being in the path of plasma that is generated in the vessel 1030. The plasma can be generated by passing an amplified light beam through an aperture 1019 in the element 1020 to irradiate a target mixture (not shown) and convert the target mixture to plasma. The element 1020 can be, for example, a collector mirror that receives EUV light emitted by the plasma and focuses the light to a location that is out of the page of FIG. 10A. Thus, in FIG. 10A, the optical path of the amplified light beam and the focused EUV light is in a direction that is out of the page (opposite to the direction 1008, which is into the page). The optical path of the amplified light beam is out of the page, but also passes through the aperture 1019.

As compared to the transport systems shown in FIGS. 3A-3C, 8B, 9A, and 9B, the conduits 1050a and 1050b of the transport system 1000 are outside of the optical path. Like the transport system 300, the transport system 1000 can be used to clean the element 1020 "in-situ," or while the element 1020 is inside of the vessel 1030. Additionally, because the transport system 1000 is out of the optical path, the transport system 1000 can be used while the light source is in operation.

The conduits 1050a, 1050b have linear portions 1080a, 1080b and curved portions 1081a, 1081b. The curved portions 1081a, 1081b follow an edge 1027 of the element 1020, avoiding the optical path. The conduits 1050a, 1050b are made of a material that has a low recombination coefficient and thus delivers free radicals from the sources 1010a, 1010b to the interior of the vessel 1030.

Figure 10B:
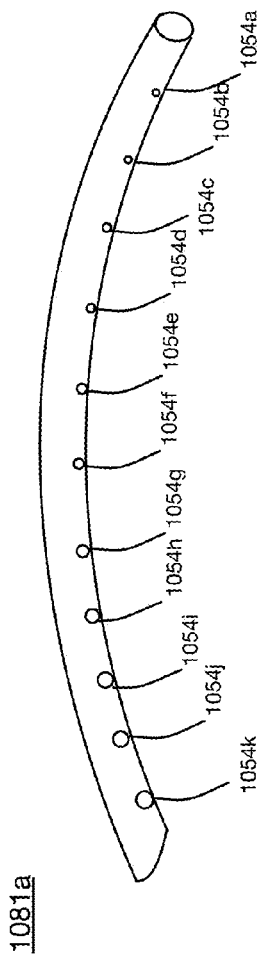
FIG. 10B shows a perspective view of a conduit used in the system of FIG. 10A.

Referring also to FIG. 10B, which shows the curved portion 1081a in more detail, the curved portion 1081a defines openings 1054a-1054k that pass free radicals and gas from an interior of the conduit 1050 toward the element 1020. The openings 1054a-1054k have different sizes, and the sizes increase with increasing distance from the source 1010a.

More or fewer openings can be formed in the curved portion 1081a than are shown in the example of FIG. 10B. The openings can be arranged similarly to one or more of the arrangements of openings shown and described with respect to FIGS. 3A-3B, 5, 6, and 7. For example, a plurality of rows of openings similar to the collection of openings 1054a-1054k can be formed in the portion 1081a. The conduit 1050b has similar openings in the portion 1081b, oriented to direct free radicals toward the element 1020.

Figure 11:
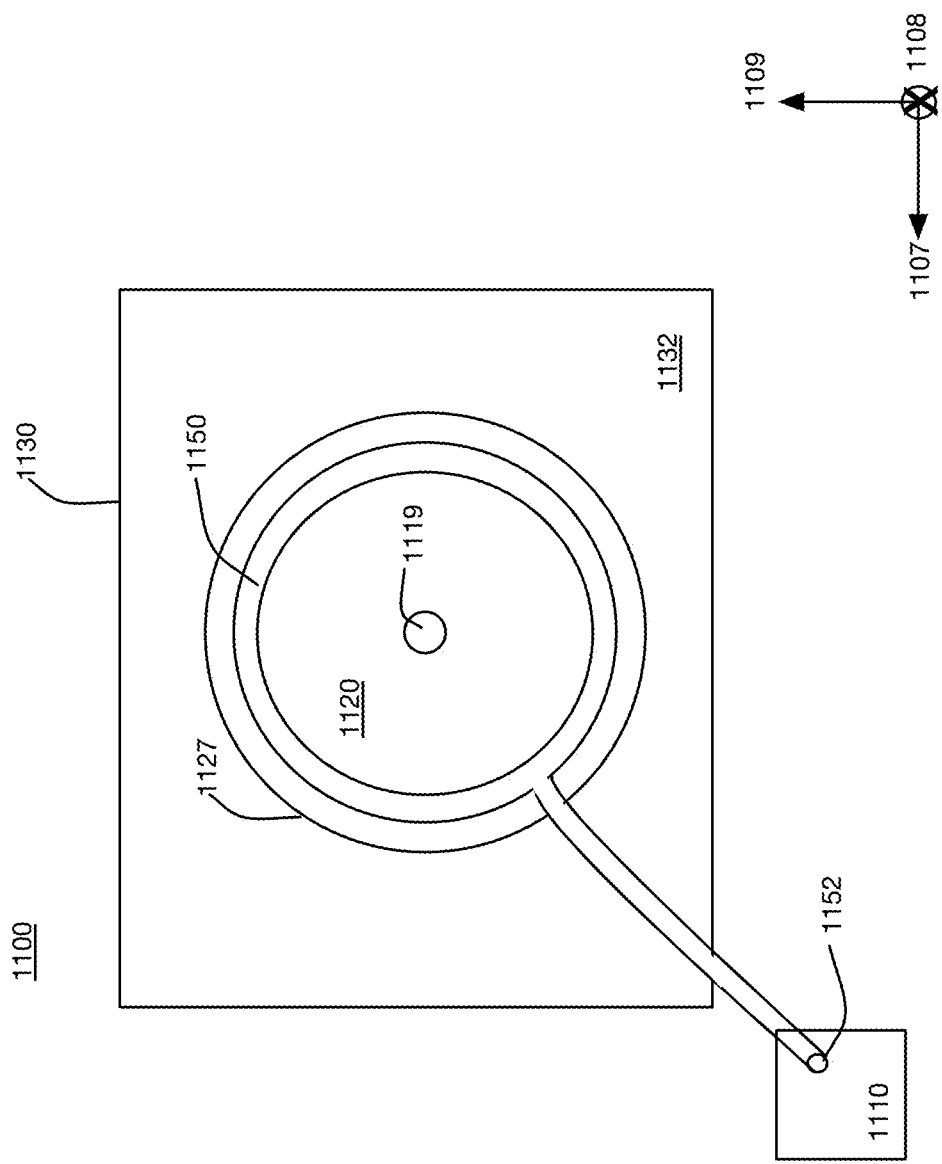
FIG. 11 shows a plan view of another exemplary free radical transport system.

Referring to FIG. 11, another exemplary free radical transport system 1100 is shown. The free radical transport system 1100 includes a conduit 1150 that follows an edge 1127 of an element 1120 to be cleaned. Like the transport system 1000 of FIG. 10A, the transport system 1100 includes a conduit that is out of the optical path of the amplified light beam that is used to generate plasma and/or EUV light that is focused by the element 1120.

The transport system 1100 includes a conduit 1150 that is coupled to a source of free radicals 1110. Like the conduits 1050a, 1050b, the conduit 1150 is made of a material that has a low recombination coefficient and, thus, transports the free radicals generated by the source 1110 to the interior 1132 of a vessel 1130 that contains the element 1120. The conduit 1150 defines openings that pass free radicals toward the element 1120.

Figure 12:
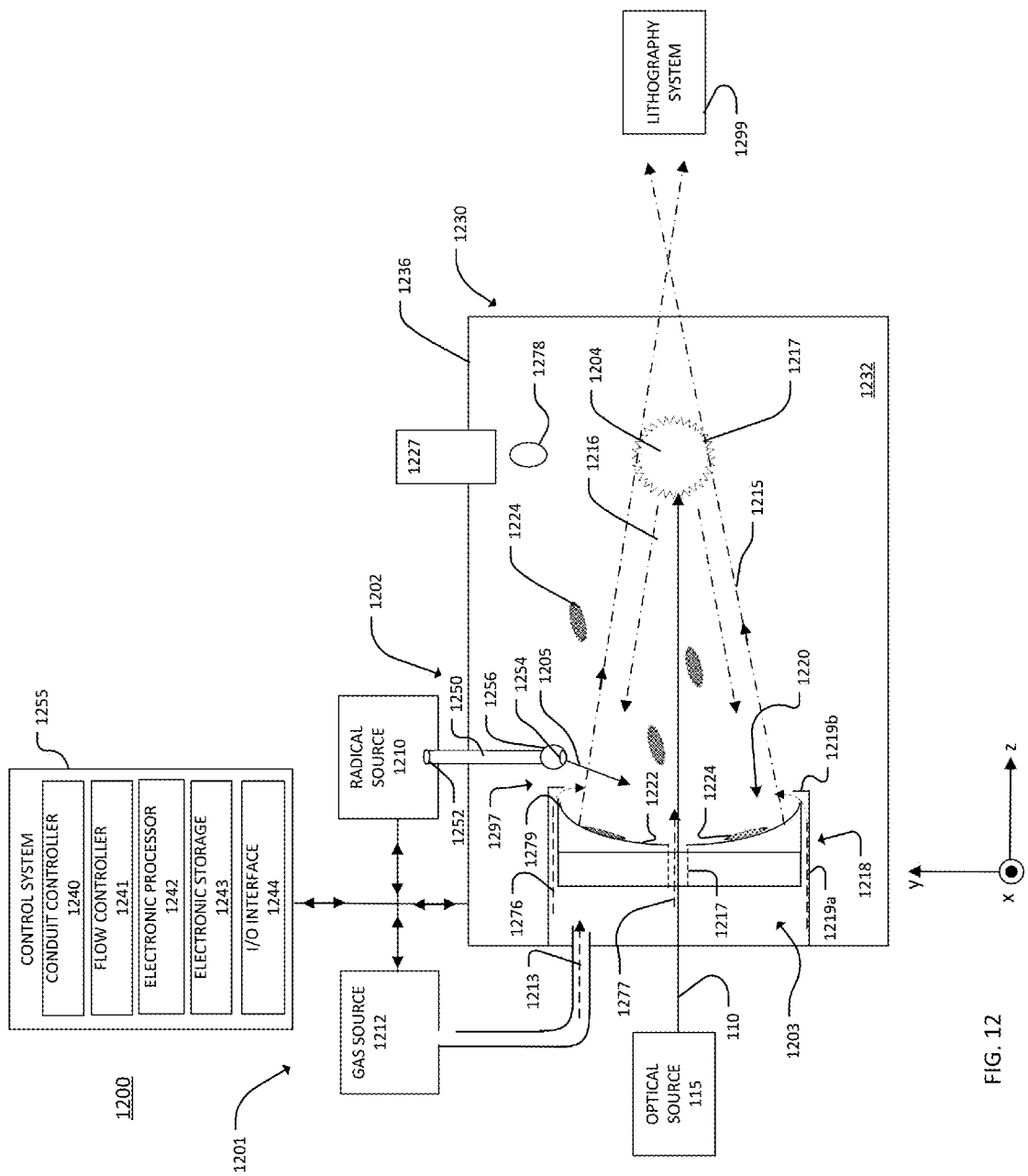
FIG. 12 shows a block diagram of an exemplary EUV light source.

Referring to FIG. 12, a block diagram of an exemplary EUV light source 1200 is shown. The light source 1200 includes an element cleaning system 1201. Like the transport systems 300, 1000, and 1100, the element cleaning system 1201 can be used to clean an element 1220, which is in an interior 1232 of a vacuum vessel 1230, with free radicals 1205 "in-situ" (while the element 1220 is in the interior 1232 of the vessel 1230 and without having to move the element 1220). As discussed above, a free radical is an atom, molecule, or ion that has an unpaired valence electron or an open electron shell, and, therefore, may be seen as having a dangling covalent bond. The dangling bonds can make free radicals highly chemically reactive, that is, a free radical can react readily with other substances. Because of their reactive nature, free radicals can be used to remove a substance (such as debris) from an object. The free radicals can remove the debris by, for example, etching, reacting with, and/or combusting the debris.

In addition to the free radicals 1205, the element cleaning system 1201 also uses gasses 1276 and 1277, which are gasses that do not include free radicals, to clean the element 1220. Using the gasses 1276 and 1277 with the free radicals 1205 can achieve quicker cleaning of the element 1220. In FIG. 12, the free radicals 1205 are shown with solid line arrows and the gasses 1276 and 1277 are shown with dashed line arrows.

Figure 13A:
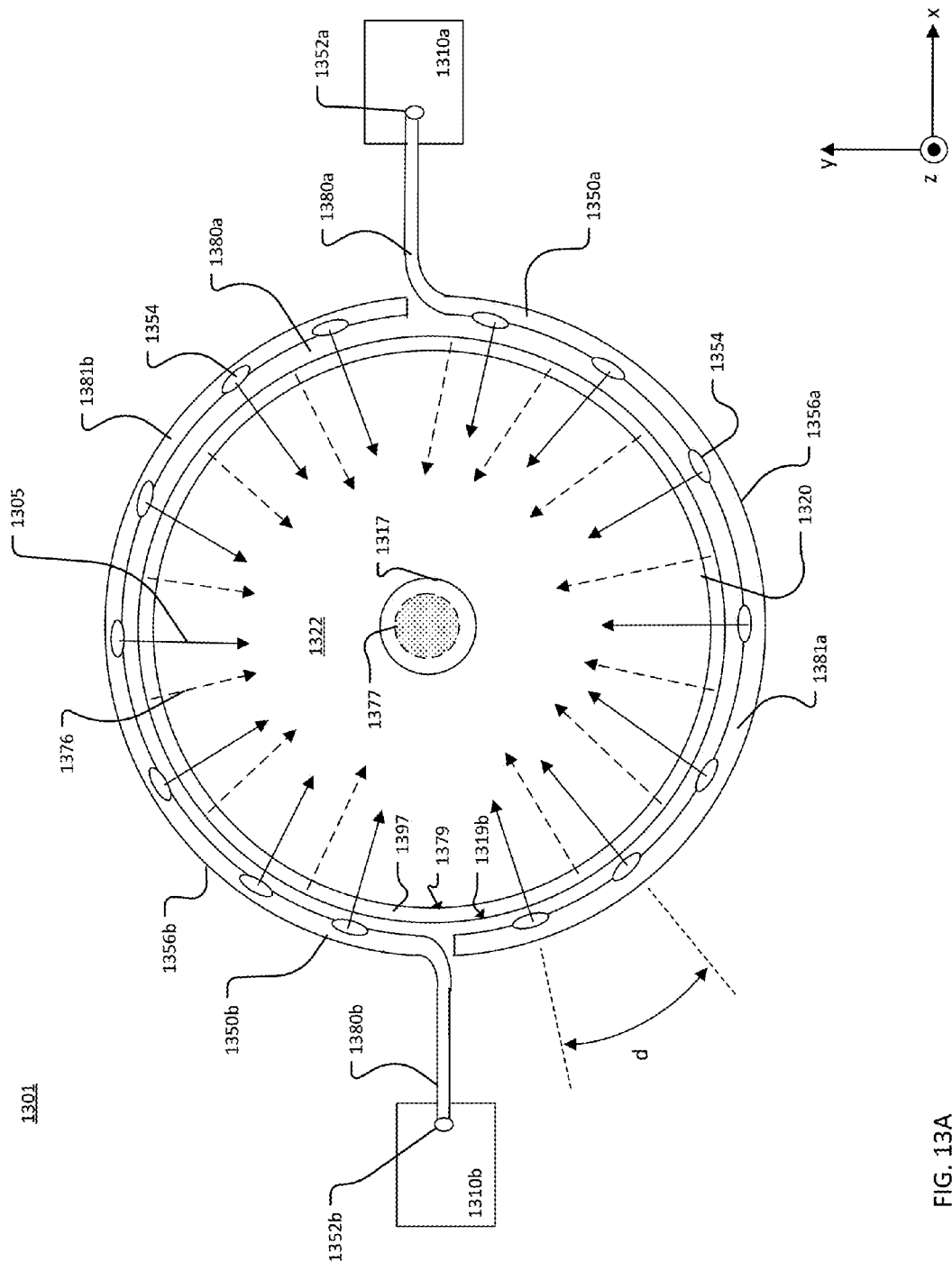
FIG. 13A shows a partial front view of an element cleaning system.
Figure 13B:
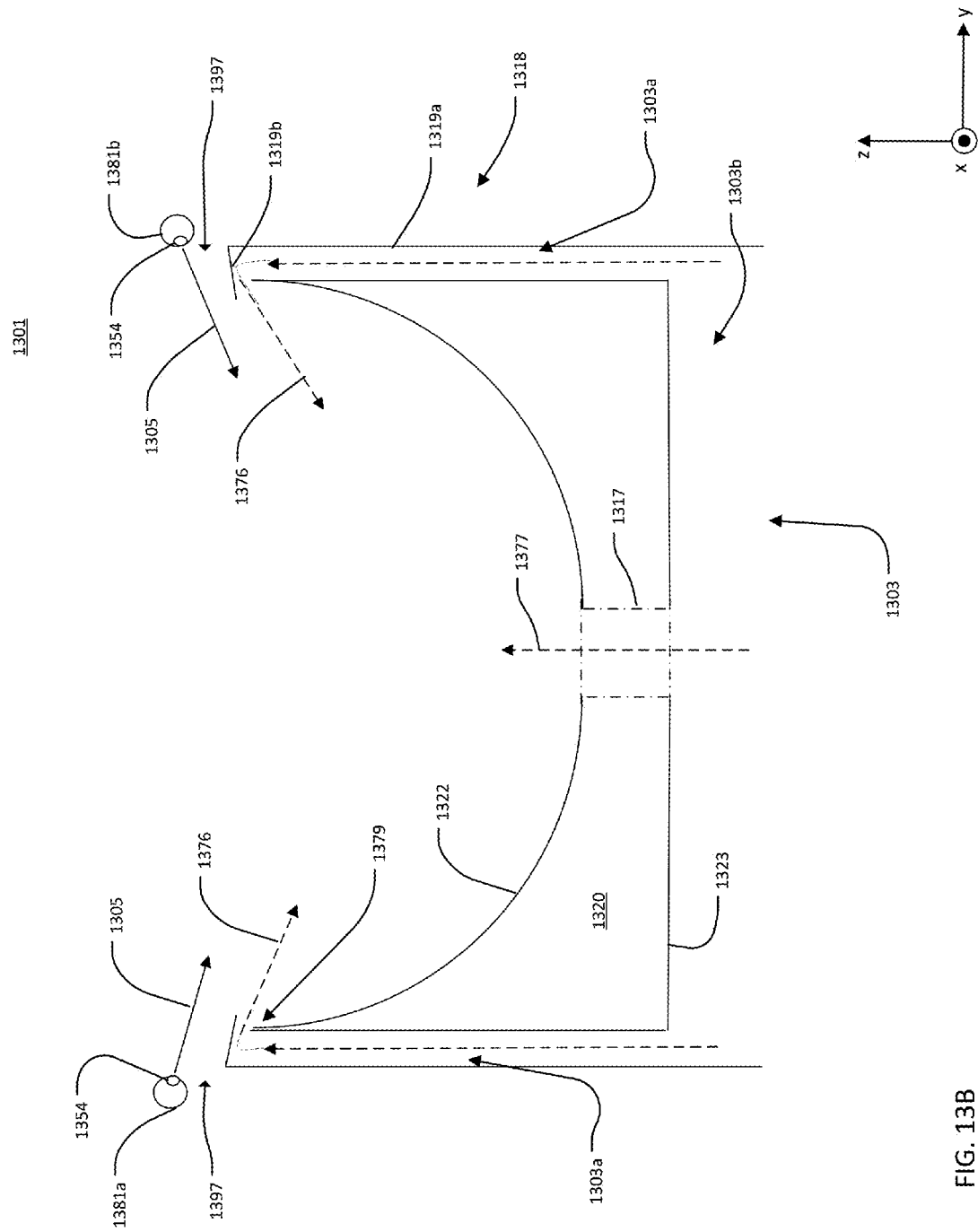
FIG. 13B shows a partial side view of the system of FIG. 13A.

The element cleaning system 1201 includes a free radical transport system 1202, which directs free radicals 1205 through a conduit 1250 to a surface 1222 of the element 1220. The conduit 1250 can be, for example, any of the conduits 250 (FIGS. 2A-2C), 350 (FIGS. 3A-3C), 550 (FIG. 5), 650 (FIG. 6), 750 (FIG. 7), 850 (FIGS. 8A and 8B), 950 (FIGS. 9A and 9B), 1050 (FIGS. 10A and 10B), or 1150 (FIG. 11), or the conduit 1250 may have another design. FIGS. 13A and 13B, discussed below, show an example of a conduit that can be used in the light source 1200. The conduit 1250 is out of the optical path of the light source 1200, thus, the element cleaning system 1201 can be operated to clean the surface 1222 of the element 1220 while the light source 1200 is in operation (for example, while the light source 1200 is producing the EUV light 1216).

The element cleaning system 1201 also includes a control system 1255 and a gas source 1212, which provides a gas 1213 (such as diatomic molecular hydrogen ($H_2$) gas, helium gas (He), and/or argon gas (Ar)) to the interior 1232 of the vacuum vessel 1230. The control system 1255 controls the flow of the gas 1213 and the flow of the free radicals 1205. The gas 1213 that enters the interior 1232 flows into a space 1203 around the element 1220. The gas flows in the space 1203 as the gas 1276 and the gas 1277.

The light source 1200 includes a target material supply apparatus 1227, which delivers target material 1278 to a target location 1204 in the interior 1232 of the vacuum vessel 1230. The amplified light beam 110, which is emitted from the optical source 115, passes through a sidewall 1236, which defines the interior 1232 of the vacuum vessel 1230, and an aperture 1217 of the element 1220 in the z direction to the target location 1204. The amplified light beam 110 interacts with the target material 1278 to form a plasma 1217 that emits EUV light 1216 and debris 1224. Some of the EUV light 1216 is reflected by the surface 1222 of the element 1220 as reflected EUV light 1215. The reflected EUV light 1215 exits the vacuum vessel 1230 toward a lithography system 1299.

The free radical transport system 1202 includes a source 1210 and the conduit 1250, which transports free radicals from the source 1210. The conduit 1250 is coupled to the source 1210 at an opening 1252 that is formed in an end of the conduit 1250. Free radicals generated at the source 1210 flow into the conduit 1250 through the opening 1252 and exit the conduit 1250 through an opening 1254 that passes through a sidewall 1256 of the conduit 1250. The free radicals 1205 can flow from the source 1210 into the interior 1232 of the vacuum vessel 1230 due to a pressure differential between the interior 1232 of the vacuum vessel 1230 and the source 1210 and/or the interior of the conduit 1250, with the pressure of the interior 1232 being lower than the pressure at the source 1210 and the pressure in the interior of the conduit 1250. The free radicals 1205 that exit the conduit 1250 through the opening 1254 are directed toward the surface 1222 of the element 1220 by positioning the opening 1254 toward to the surface 1222.

The conduit 1250 is made of a material that does not react or combine with the free radicals 1205 or one that has a low recombination coefficient (for example, a recombination coefficient of about 5×10' or less). The recombination coefficient is a measure of a probability that a radical will recombine on or otherwise attach to material surface after a single collision with that surface. In the context of the free radicals 1205 that travel through the conduit 1250, the recombination coefficient of the material on an inner wall of the conduit 1250 (or other surfaces of the conduit 1250 to which free radicals are exposed) determines, in part, the portion of radicals generated by the source 1210 that reach the element 1220. Materials that have a lower recombination coefficient allow a larger portion of the free radicals generated by the source 1210 to reach the element 1220 by reducing the portion of free radicals that are lost by recombination through collisions with inner walls of the conduit 1250.

The conduit 1250 can be made of Teflon, quartz, or glass such as borosilicate glass (for example, Pyrex). In some implementations, the conduit 1250 can be made of a metal that is coated, for example, with a material that has a low recombination coefficient, at the portions that could come into contact with a free radical 1205. For example, the conduit 1250 can be an aluminum conduit having an interior surface and ends that are coated with Pyrex. In another example, the conduit 1250 can be made of an oxidized metal, such as silicon dioxide ($SiO_2$), titanium oxide ($TiO_2$), or aluminum oxide ($AlO_2$). As yet another example, the conduit can be made of an anodized metal, such as anodized aluminum. Although a conduit made from a metal oxide can have a higher recombination coefficient than one made from a non-metallic material, a metal conduit can be relatively easier to machine and can be more rugged.

The conduit 1250 is positioned in the interior 1232 relative to the element 1220 with a gap 1297 between the conduit 1250 and the element 1220. The gap 1297 is a physical separation between the element 1220 and the conduit 1250 through which fluid can pass. In other words, at least a portion of the conduit 1250 does not make physical contact with the element 1220. Additionally, the conduit 1250 is positioned so that no part of the conduit 1250 intersects the amplified light beam 110. Furthermore, the conduit 1250 is positioned to not be between the surface 1222 of the element 1220 and the EUV light 1216 emitted from the plasma 1217. In this manner, the element cleaning system 1201 can be operated to clean the element 1220 while the light source 1200 produces EUV light 1216.

In the example shown, the element 1220 is held and supported in a fixed location in the interior 1232 of the vacuum vessel 1230 by a mount 1218. The mount 1218 has a sidewall 1219*a*, which extends into the interior 1232 of the vacuum vessel 1230, and a lip 1219*b*, which extends from the sidewall 1219*a* into a gap 1297. The lip 1219*b* extends from the sidewall 1219*a* along a different direction than the direction that the sidewall 1219*a* extends. In the example shown in FIG. 12, the sidewall 1219*a* extends along the z direction, and the lip 1219*b* extends away from an end of the sidewall 1219*a* along the y direction, which is perpendicular to the z direction.

When the element 1220 is in the mount 1218, the space 1203 is formed between the sidewall 1219*a* and the element 1220 and/or on a side of the element 1220, which is on a side of the element 1220 other than a side that includes the surface 1222. Some of the gas 1213 from the gas source 1212 flows through the portion of the space 1203 that is between the sidewall 1219*a* and the element 1220. The gas that flows through this portion of the space 1203 is shown as the gas 1276 in FIG. 12.

The relative orientation of the lip 1219*b* and the sidewall 1219*a* causes the gas 1276 to be directed toward the surface 1222 of the element 1220. The lip 1219*b* extends away from the sidewall 1219*a* from a location that is just outside of a perimeter 1279 of the element 1220 toward the center of the element 1220. Thus, the gas 1276 flows from the perimeter 1279 of the element 1220 toward the center of the element 1220. The gas 1276 can be referred to as "perimeter gas flow." When the conduit 1250 is positioned to direct the free radicals 1205 from the perimeter 1279 of the element 1220, the gas 1276 and the free radicals 1205 can together be referred to as a "perimeter flow."

The gas 1213 from the gas source 1212 also flows through the aperture 1217 of the element 1220. The gas that flows through the aperture 1217 is labeled as gas 1277 in the example of FIG. 12 and can be referred to as "aperture gas flow." The gas source 1212 is a source of gas that does not include free radicals. Although one gas source 1212 is shown in FIG. 12, the light source 1200 can include a plurality of gas sources that deliver gas to the interior 1232 of the vacuum vessel 1230. For example, one gas source can deliver the gas 1275 and another gas source can deliver the gas 1276.

The element cleaning system 1201 also includes the control system 1255. The control system 1255 controls the position of the conduit 1250 relative to the element 1220, and also controls the flow of the gas 1276, the gas 1277, and/or the free radicals 1205. For example, the control system 1255 can adjust the flow rates of the gas 1276, the gas 1277, and/or the free radicals 1205 relative to each other to decrease the amount of time required to remove the debris 1224 from the surface 1222. In some implementations, the control system 1255 can start or stop the flow of one of more of the gas 1276, the gas 1277, and/or the free radicals 1205 to initiate or end a cleaning cycle.

The example control system 1255 shown in FIG. 12 includes a conduit controller 1240, a flow controller 1241, an electronic processor 1242, an electronic storage 1243, and an input/output (I/O) interface 1244. The conduit controller 1240 controls the position of the conduit 1250 relative to the element 1220. The conduit controller 1240 can control the position of the conduit 1250 (and the opening 1254 through which the free radicals 1205 exit the conduit 1250) in the x, y, and/or z directions, and the conduit controller 1240 can rotate the conduit 1250 and the opening 1254 relative to the element 1220 and the surface 1222. For example, the conduit controller 1240 can move the opening 1254 closer to the element 1220 in the z direction, or the conduit controller 1240 can move the conduit 1250 relative to the element 1220 in the x-y plane to direct the free radicals 1250 toward one portion of the surface 1222 at a time. The conduit controller 1240 can be used to position the conduit 1250 relative to the element 1220 and the surface 1222 when the conduit 1250 is initially installed in the interior 1232 of the vacuum vessel 1230, after the conduit 1250 has been installed in the interior 1232, and/or while the light source 1200 and radical transport system 1202 are in use.

The conduit controller 1240 includes components that are electronically controlled. For example, the conduit 1250 can be coupled to a stepper motor or other device that moves the conduit 1250 when activated by a user or an automated electronic process. The conduit controller 1240 can include components that are configured for manual operation, for example, with a lever, wheel, or other mechanical device that is accessible from outside of the vessel 1230 and allows an operator of the light source 1200 to move the conduit 1250.

The flow controller 1241 is used to control the flow of the free radicals 1205 and the gasses 1276 and/or 1277. The flow controller 1241 can include a mass flow controller that measures and/or controls the flow of the gas 1276 and/or the gas 1277 and a pressure controller that controls the relative pressure between the source 1210 of free radicals and the interior 1232 of the vacuum vessel 1230. The mass flow controller is connected to the gas source 1212, and the mass flow controller includes an input port, an outlet port, a mass flow sensor, and a valve. The mass flow controller adjusts the valve to adjust the flow of gas from the gas source 1212. Alternatively, the mass flow rates of gas 1276 and gas 1277 can be controlled separately using two separate mass flow controllers and two separate inlet gas systems (not shown).

The pressure controller can control one or more of the pressure of the source 1210 of free radicals and the pressure in the interior 1232. The free radicals from the source 1210 flow into the interior 1232 of the vacuum vessel 1230 when the pressure in the interior 1232 is lower than the pressure at the source 1210.

In some implementations, the control system 1255 does not include the conduit controller 1240 and/or the flow controller 1241. For example, in some implementations, the conduit 1250 is permanently positioned relative to the element 1220 and is not moved after installation or during use. In these implementations, the control system 1255 can lack the conduit controller 1240 or the conduit controller 1240 can be disabled.

The electronic processor 1242 is one or more processors suitable for the execution of a computer program such as a general or special purpose microprocessor, and any one or more processors of any kind of digital computer. Generally, a processor receives instructions and data from a read-only memory or a random access memory or both. The electronic processor 1242 can be any type of electronic processor.

The electronic storage 1243 can be volatile memory, such as RAM, or non-volatile memory. In some implementations, the electronic storage 1243 can include both non-volatile and volatile portions or components. The electronic storage 1243 stores instructions, perhaps as a computer program, that, when executed, cause the processor 1242 to communicate with other components in the control system 1255. For example, the control system 1255 can receive an input from a human operator or an automated electronic process at the I/O interface 1244 requesting that the flow rate of the gas 1277 be changed, and the processor 1242 can communicate a command to the flow controller 1241 to cause the mass flow controller to measure or determine the current flow rate of the gas 1277 and adjust the flow rate to match the requested flow rate.

The I/O interface 1244 is any kind of electronic interface that allows the control system 1255 and/or its components to receive and/or provide data and signals to an operator and/or an automated process running on another electronic device. For example, the I/O interface 1244 can include one or more of a touch screen or a communications interface.

Referring to FIGS. 13A and 13B, top and side block diagrams, respectively, of an exemplary optical element 1320 and components of an exemplary element cleaning system 1301 are shown. The optical element 1320 is a mirror with a reflective surface 1322 that is positioned in the path of EUV light and debris that are generated by a plasma that is created from an interaction between an amplified light beam (such as the light beam 110) and a target material (such as the target material 1278). The optical element 1320 may be referred to as a collector. The element cleaning system 1301 is out of the path of the amplified light beam and is not between the surface 1322 and the EUV light emitted by the plasma. Thus, the element cleaning system 1301 can be used while an EUV light source that includes the optical element 1320 is in use and while the light source generates EUV light.

The element cleaning system 1301 can be similar to the element cleaning system 1201 discussed above with respect to FIG. 12. The element cleaning system 1301 includes conduits 1350a, 1350b that can be installed in an EUV light source at the time that the EUV light source is manufactured or as a retrofit of an existing EUV light source.

The element cleaning system 1301 cleans the element 1320 by delivering free radicals 1305, a gas 1376, and a gas 1377 to the surface 1322. The gasses 1376 and 1377 can be the same type of gas, and the gasses 1376 and 1377 can be gasses that do not contain free radicals. The gasses 1376 and 1377 are generated by one or more gas sources, such as the gas source 1212 (FIG. 12). In FIGS. 13A and 13B, the free radicals 1305 are shown with solid line arrows and the gasses 1376 and 1377 are shown with dashed line arrows.

The optical element 1320 has a circular cross-section in the x-y plane (FIG. 13A) and the surface 1322 is curved as shown in FIG. 13B. The optical element 1320 has an aperture 1317 that passes through the optical element 1320 in the z direction. The amplified light beam propagates through the aperture 1317 from a side 1323 (FIG. 13B) toward the target material, and the gas 1377 flows through the aperture 1317 in the z direction. The optical element 1320 also has a perimeter 1379. The perimeter 1379 includes the portions of the optical element 1320 that are furthest from the center of the aperture 1317, including the circumferential edge of the optical element 1320. In the example of FIGS. 13A and 13B, the perimeter 1379 has a circular shape in the x-y plane.

The element 1320 is held by a mount 1318 that includes a sidewall 1319a. A space 1303 is formed between the mount 1318 and portions of the element 1320. The space 1303 includes a region 1303a, which is between the sidewall 1319a and the element 1320, and a region 1303b, which is at the side 1323 of the element 1320. The space 1303 receives the gasses 1376 and 1377 from one or more gas sources (not shown). In some implementations, a shroud, such as the hollow conical shroud 150 (FIG. 1A), that has sides that taper in the z direction to define an open region can be placed in the space 1303b in contact with the side 1323 and with the open region of the shroud in fluid communication with the aperture 1317. In these implementations, the gas 1377 flows in the z direction through the open region defined by the shroud before flowing through the aperture 1317.

The mount 1318 also includes a lip 1319b that extends from the sidewall 1319a at an angle. The lip 1319b extends into a gap 1397, which is an open region between the perimeter 1379 and a portion of a conduit 1350a, 1350b that delivers the free radicals 1305 to the surface 1322. The lip 1319b surrounds the perimeter 1379 but is displaced, in the z direction and radially, from the perimeter 1379. In other words, a gas that flows in the z direction in the space 1303a interacts with the lip 1319b and flows out of the space 1303a from the perimeter 1379 toward the surface 1322.

The element cleaning system 1301 includes two conduits 1350a and 1350b that transport free radicals from respective sources 1310a, 1310b of free radicals to the surface 1322 of the element 1320. The conduits 1350a, 1350b include sidewalls 1356a, 1356b, each of which define an interior of the respective conduit 1350a, 1350b. The conduits 1350a, 1350b are made of a material that does not react or combine with the free radicals or one that has a low recombination coefficient (for example, a recombination coefficient of about $5 \times 10^{-3}$ or less) so that free radicals 1305 can flow in the interiors of the conduits 1350a, 1350b. For example, the conduits 1350a, 1350b can be made of Teflon, quartz, or glass such as borosilicate glass (for example, Pyrex), or a metal that is coated with a material that has a low recombination coefficient.

The sidewalls 1356a, 1356b of the conduits 1350a, 1350b include respective linear portions 1380a, 1380b and curved portions 1381a, 1381b. In the linear portions 1380a, 1380b, the sidewalls 1356a, 1356b extend along a longitudinal axis that is substantially straight. The linear portion 1380a is connected to the source 1310a at an opening 1352a, which is formed in an end of the linear portion 1380a, and the linear portion 1380b is connected to the source 1310b at an opening 1352b, which is formed in an end of the linear portion 1380b. Free radicals generated by the sources 1310a, 1310b flow through the openings 1352a, 1352b into the linear portions 1380a, 1380b, respectively. The interior of the linear portion 1380a is in fluid communication with the interior of the curved portion 1381a, and the interior of the linear portion 1380b is in fluid communication with the interior of the curved portion 1381b. Thus, free radicals that flow into the linear portions 1380a, 1380b can flow into the respective curved portions 1381a, 1381b.

The sidewalls 1356a, 1356b are curved in the curved portions 1381a, 1381b. The curved portions 1381a, 1381b include openings 1354 that pass through the sidewalls 1356a, 1356b to allow free radicals in the interior of the curved portions 1381a, 1381b to exit the conduit 1350a, 1350b. For simplicity, only one opening 1354 is labeled on each of the curved portions 1381a, 1381b. However, the curved portions 1381a, 1381b can include any number of openings 1354 that are spaced from each other along a curved portion by a center-to-center radial distance "d." The openings 1354 can have a diameter of, for example, 4.5-6.5 millimeter (mm). The openings 1354 can have a circular cross-section. The distance "d" between two of the openings 1254 can be, for example, 1-10 centimeters (cm).

Additionally, the openings 1354 can all be the same size, or the size of the openings 1354 can vary. For example, the openings can become larger as the distance that a free radical travels from the source 1310a, 1310b increases. Such an arrangement may allow the free radicals 1305 to exit the conduits 1350a, 1350b at the same rate from all of the openings 1354.

In some implementations, the spacing "d" between openings 1354 can be made variable along the length of the curved portions 1381a and 1381b. In other words, the spacing "d" can be different between any two of the openings 1354. For example, the spacing "d" between the openings 1354 can be made smaller as the free radicals travel distance from the sources 1310a, 1310b increases. That is, the openings 1354 can be closer together (the spacing "d" lower) in the part of the curved portions 1381a, 1381b that are away from the linear portions 1380a, 1380b and farther apart in the parts of the curved portions 1381a, 1381b that are near the linear portions 1380a, 1380b. This configuration of the openings 1354 can result in the free radicals being delivered at the same rate from every unit length of the curved portions 1381a, 1381b regardless of the distance to the sources 1310a, 1310b. In some implementations, a combination of different holes diameters and different spacing "d" between the openings 1354 throughout the length of the curved portions 1381a, 1381b can also be used to provide radicals at the same rate from every length of the curved portions 1381a, 1381b regardless of the distance to the sources 1310a, 1310b.

The curved portions 1381a, 1381b are displaced from the element 1320 in the z direction, and the gap 1397, which is a space through which gas can flow, is formed between the curved portions 1381a, 1381b and the perimeter 1379. In the configuration shown in FIGS. 13A and 13B, the curved portions 1381a, 1381b are in an x-y plane that is parallel to an x-y plane that contains the perimeter 1379, with these two x-y planes being separated in the z direction by the gap 1397. However, the curved portions 1381a, 1381b can be positioned in other configurations relative to the element 1320. Additionally, either or both of the curved portions 1381a, 1381b can be moved relative to the element 1320 to, for example, optimize cleaning of a particular portion of the surface 1322.

In the example of FIG. 13A, each of the curved portions 1381a, 1381b forms part of a circle. The radius of the circle formed by both of curved portions 1381a, 1381b is the same or greater than the radius of the element 1320. The radius of curvature of the portions 1381a, 1381b is the same or greater than the radius of curvature of the perimeter 1379 of the element 1320. Thus, when the curved portions 1381a, 1381b are placed above (in the z direction) and radially outside of the perimeter 1379, such as the configuration of FIGS. 13A and 13B, the openings 1354 can be oriented such that free radicals 1305 flow from a region near the perimeter 1379 radially inward toward the surface 1322. For example, the curved portions 1381a, 1381b, which include the openings 1354, can be at the perimeter 1379 or at a distance of up to, for example, 10-15 centimeters (cm) from the perimeter 1379.

Additionally, as discussed above, the lip 1319b of the mount 1318 extends into the gap 1397 at an angle from the sidewall 1318a to direct the gas 1376 radially inward toward the surface 1322. The lip 1319b is also above (in the z direction) and radially outside of the perimeter 1379. Thus, the gas 1376 also flows from the perimeter 1379. In these configurations, the free radicals 1305 and gas 1376 can be referred to as "perimeter flow."

Due to the configuration of the conduits 1350a, 1350b, the element 1320 can be cleaned by the element cleaning system

1301 while the EUV light source in which the conduits 1350a, 1350b and element 1320 are placed produces EUV light.

Figure 14:
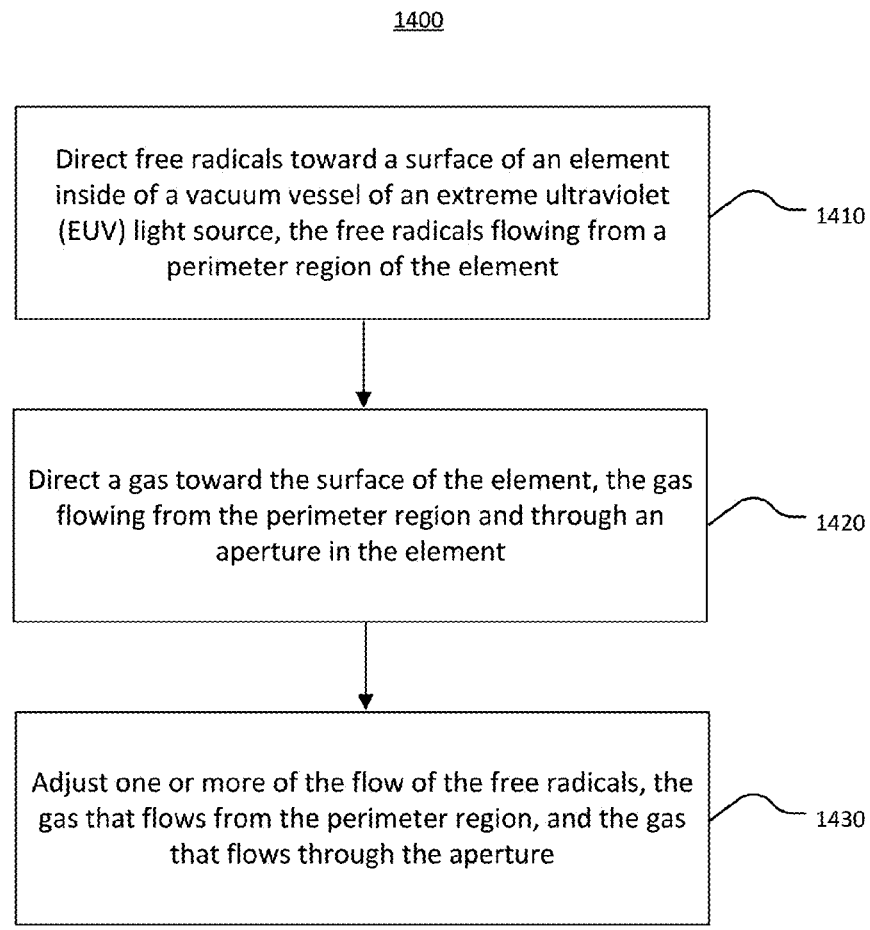
FIG. 14 is a flow chart of an exemplary process for cleaning an element in an EUV light source.

Referring to FIG. 14, a flow chart of an exemplary process 1400 is shown. The process 1400 is used to remove debris from an element that is inside of a vacuum vessel of an EUV light source. The process 1400 removes debris from the element without requiring that the element be removed from the vacuum vessel and while the EUV light source is operating (for example, while the EUV source is producing EUV light).

The process 1400 is discussed with respect to the EUV light source 1200 of FIG. 12 and can be performed by the one or more electronic processors 1242 of the control system 1255. For example, the process 1400 can be a set of instructions, perhaps a computer program, stored on the electronic storage 1242 that when executed cause the one or more electronic processors 1242 to cause various components of the control system 1255 and/or the light source 1200 to interact to clean the element 1220. However, the process 1400 can be performed with any EUV light source that includes an element cleaning system such as the element cleaning systems 1201 (FIG. 12) or 1301 (FIG. 13A).

Free radicals are directed toward the surface 1222 (1410). The free radicals can be, for example, hydrogen radicals. The free radicals 1205 are directed to the surface 1222 by orienting an opening 1254, which is in the conduit 1250 that transports the free radicals 1205, relative to the surface 1222. For example, the free radicals 1205 can be directed from a perimeter region of the element 1220 by placing the opening 1254 near the perimeter 1279 and orienting the opening 1254 toward a center of the surface 1222 of the element 1220. The conduit 1250 can be placed at the perimeter 1279 of the collector 1220, or the conduit 1250 can be placed up to, for example 10-1 cm. In such a configuration, the free radicals 1205 flow from the outer edge of the element 1220 toward the center of the element 1220. An example of such a configuration is shown in FIGS. 13A and 13B. When a conduit such as the conduit 1350 of FIGS. 13A and 13B is used, the mass flow through the curved portion of each conduit 1350a, 1350b can be between, for example, 1-20 SLM, although larger or smaller values can also be used.

In some implementations, the conduit 1250 and the opening 1254 can be moved or positioned relative to the element 1220 and the surface 1222 to clean a particular portion of the surface 1222. For example, the conduit 1250 can be rotated relative to the surface 1222, or moved in one or more of the x, y, and z directions. In other implementations, the conduit 1250 can be permanently fixed relative to the collector 1250 and not moved during use.

The free radicals 1205 are generated by the source 1210, which is coupled to the conduit 1250 at an opening 1252. The source 1210 can be a microwave plasma generator. To produce free radicals with such a source, a gas from which the free radicals are formed is provided to the source 310. For example, to produce hydrogen radicals, hydrogen gas ($H_2$) is provided. An additional gas can be added to the gas prior to providing the gas to the source 1210. For example, a mixture of argon and oxygen ($Ar/O_2$) can be added to the hydrogen gas. Both the hydrogen gas and the additional gas mixture have a mass flow rate and velocity when provided to the source 1210. For example, the hydrogen gas can be provided to the source 310 at a mass flow rate of 3 standard liters per minute (SLM), and the $Ar/O_2$ mixture can be provided to the source at a mass flow rate of 21 standard cubic centimeters per minute (SCCM).

In some examples, the source 1210 can be operated at a hydrogen pressure of greater than about 1 millibar (mbar), with a microwave power of 5 kiloWatts (kW) or greater and the mass flow rate of the hydrogen gas being greater than 20 SLM. Under these operating conditions, a relatively large portion (for example, 30% or more) of the hydrogen gas can disassociate into hydrogen radicals that can be transported by the conduit 1250. Such operating conditions, in combination with the arrangement and geometry of the openings 1254 in the conduit 1250, can provide hydrogen radicals with a velocity of, for example, 1 meter per second (m/s) or greater.

A gas is directed toward the surface 1222 (1420). The gas 1276 is directed toward the surface 1222 by flowing through the gap 1297, and the gas 1277 is directed toward the surface by flowing through the aperture 1217. The gas 1276 and the gas 1277 are generated by the gas source 1212, which delivers gas to the interior of the vacuum vessel 1230 and into the space 1203. As discussed above, the gas source 1212 can include a plurality of separate gas sources that each deliver gas to the interior 1232 of the vessel 1230. For example, the gas 1277 and the gas 1276 can be provided by different gas sources or by a single gas source.

One or more of the flows of the free radicals 1205, the gas 1276, and the gas 1277 are adjusted (1430). The flows can be adjusted by adjusting or changing the flow rate. For example, the flow rate of the free radicals 1205 and the gas 1276 can be adjusted relative to the flow rate of the gas 1277. In implementations where the free radicals 1205 and the gas 1276 flow from a perimeter of the element to be cleaned, such as the example of FIGS. 13A and 13B, the total flow rate of the free radicals 1205 and the gas 1276 (which flow from the perimeter of the element to be cleaned) can be adjusted so that their combined flow rate is the same as the flow rate of the gas 1277 (which flows through the aperture 1217).

For example, an EUV light source that is retrofit to include or includes an element cleaning system may be optimized to operate (in the absence of free radicals) with a perimeter gas flow (similar to the gas flow 1276) at 120 SLM and a gas flow through the aperture of the element (similar to the gas flow 1277) at 120 SLM. With the element cleaning system that delivers free radicals from a perimeter of the element installed or activated, the total flow rate of the free radicals and the gas flow from the perimeter (the flow rate of "the perimeter flow") can be adjusted to be the same as the original flow rate from the perimeter (120 SLM). For example, the flow rate of the free radicals 1205 can be set to 40 SLM and the flow rate of the perimeter gas flow can be reduced from 120 SLM to 80 SLM. In this manner, the perimeter flow rate (the total flow rate of fluid from the perimeter of the element to be cleaned) remains 120 SLM even after the element cleaning system is activated in the EUV light source. This allows the EUV source to be operated with the gas constantly flowing through conduits 1381a, 1381b. Thus, if cleaning is desired, the element cleaning system can be switched ON very quickly by simply switching ON the Hydrogen radical sources 1310a, 1310b without a need for gas flow adjustments. This allows a very quick transition (for example, 1-2 seconds) from production of EUV light to cleaning the element 1220.

Other implementations are within the scope of the following claims.

For example, the radius of curvature of the curved portions 1381a, 1381b of the conduits 1350a, 1350b (FIGS. 13A and 13B) can be different than the radius of curvature of the perimeter 1379 of the element 1320. The radius of a circle or partial circle formed by the curved portions 1381a, 1381b can be smaller than the radius of the element 1320. In these implementations, the curved portions 1381a, 1381b can be positioned above (in the z direction) the element 1320 but radially inside the perimeter 1379.

The element cleaning system 1301 can include one conduit with a single curved portion that is a circle or part of a circle. The element cleaning system 1301 can include more than two conduits that, when placed in proximity to each other, have a shape that is the same as a shape of the perimeter of the element. Each of the conduits of the element cleaning system 1301 can be connected to a separate free radical source or more than one conduit can be connected to a single free radical source.

The sources of free radicals discussed above, such as the sources 210, 310, 1010a, 1010b, 1110, 1210, 1310a, and 1310b are shown as being outside of their respective vacuum vessels. However, in some implementations, the source of free radicals can be placed inside the vacuum vessel.

What is claimed is:

1. A system for an extreme ultraviolet (EUV) light source, the system comprising:
    a radical transport system comprising:
        one or more conduits, each of the one or more conduits comprising a sidewall, the sidewall comprising a linear portion and a second portion, the linear portion of the sidewall comprising a first end that defines a first opening, and the second portion of the sidewall comprising one or more openings from an interior of the conduit to an exterior of the conduit, wherein
        the second portion of at least one of the one or more conduits is configured to be positioned relative to an outer perimeter of a reflective surface of a collector that is inside of a vacuum chamber of the EUV light source with a gap between the collector and the second portion;
    a mount configured to hold the collector, the mount comprising a wall and a lip extending from the wall, the lip being angled toward the reflective surface of the collector, the gap being between the lip and the outer perimeter of the reflective surface, and
    a control system comprising:
        one or more electronic processors;
        a non-transient computer-readable medium coupled to the one or more electronic processors, the computer-readable medium comprising instructions that, when executed, cause the one or more electronic processors to:
            control a flow of a gas through an aperture of the collector,
            control a flow of the gas through the gap between the second portion of the at least one of the one or more conduits and the collector, and
            control a flow of free radicals through the one or more openings in the second portion of the one or more conduits.

2. The system of claim 1, wherein a perimeter of the second portion of the sidewall has the same shape of at least a portion of the perimeter of the collector that is inside of a vacuum chamber of the EUV light source.

3. The system of claim 1, wherein the flow of gas through the aperture has a first flow rate, the flow of gas through the gap has a second flow rate, and the flow of free radicals has a third flow rate.

4. The system of claim 3, wherein:
    the instructions to cause the one or more processors to control the flow of the gas through the aperture of the collector comprise instructions to cause the one or more processors to adjust the first flow rate,
    the instructions to cause the one or more processors to control the flow of the gas through the gap comprise instructions to cause the one or more processors to adjust the second flow rate, and
    the instructions to cause the one or more processors to control the flow of the free radicals comprise instructions to cause the one or more processors to adjust the third flow rate.

5. The system of claim 4, wherein the instructions to cause the one or more processors to adjust the third flow rate comprise instructions to cause the one or more processors to lower a pressure at the one or more openings in the second portion of the conduit relative to the first opening at the first end of the linear portion of the conduit.

6. The system of claim 4, wherein one or more of the first flow rate, the second flow rate, and the third flow rate are adjusted until the first flow rate is the same as the sum of the second flow rate and the third flow rate.

7. The system of claim 1, further comprising a source of free radicals coupled to the conduit at the first opening.

8. The system of claim 7, wherein the linear portion of the sidewall passes through a wall of the vacuum chamber.

9. The system of claim 1, wherein the side wall of the second portion of the conduit is curved.

10. The system of claim 1, wherein the side wall of the second portion of the conduit forms an arc of a circle.

11. The system of claim 1, wherein
    the perimeter of the collector is in a first plane and each second portion the second of the one or more conduits are in a second plane, different from the first plane, and
    the second plane does not include any portion of the collector.

12. The system of claim 11, wherein the first plane and the second plane are parallel to each other.

13. The system of claim 1, wherein the free radicals comprise hydrogen radicals, and the gas comprises hydrogen gas.

14. The system of claim 1, wherein the perimeter of the collector is a circle, and the one or more conduits comprise two conduits, the shape of the second portion of the sidewall of each of the two conduits being arc of the circle, and each of the second portions being positioned relative to a different portion of the perimeter of the collector.

15. The system of claim 1, wherein the second portion of the sidewall of at least one of the conduits comprises more than one opening, each of the more than one opening having a different diameter.

16. The system of claim 15, wherein the second portion of the sidewall of each of the conduits comprises more than one opening, each of the more than one openings having a different diameter.

17. The system of claim 15, wherein the second portion of the sidewall of each of the conduits comprises more than one opening, each of the more than one opening being spaced from the nearest opening on the second portion of the sidewall by a spacing distance.

18. The system of claim 17, wherein the spacing distance varies.

19. The system of claim 18, wherein the spacing distance decreases as the distance from the linear portion increases.

20. The system of claim 1, wherein the lip has the same shape as a perimeter of the collector,
    the collector is placed in the mount with a space between the perimeter of the collector and the lip, the gap between the perimeter of the collector and the second portion of the one or more conduits further comprises the space, and at least some of the gas that flows through the gap between the second portion of the one or more conduits and the perimeter of the collector flows through the space.

21. A method of removing debris from an element inside of a vacuum chamber of an extreme ultraviolet (EUV) light source, the method comprising:

directing free radicals toward a surface of the element inside of a vacuum chamber of the EUV light source, the free radicals flowing from an outer perimeter region of the element at a first flow rate;

directing a gas toward the surface of the element inside of a vacuum chamber of an EUV light source, the gas flowing through a gap formed between a mount and the outer perimeter region of the element, a lip of the mount directing the gas from the outer perimeter region of the element toward the surface of the element at a second flow rate;

directing gas through an aperture in the center of the element at a third flow rate; and adjusting one or more of the first flow rate and the second flow rate relative to the third flow rate.

22. The method of claim 21, wherein adjusting the first flow rate and the second flow rate relative to the third flow rate comprises adjusting one or more of the first flow rate and the second flow rate until the sum of the first flow rate and the second flow rate are the same as the third flow rate.

23. The method of claim 21, wherein adjusting the first flow rate and the second flow rate relative to the third flow rate comprises adjusting the first flow rate and the second flow rate until the sum of the first flow rate and the second flow rate are the same as the third flow rate.

24. The method of claim 21, wherein the free radicals and the gas are directed toward the surface of the element while a plasma that emits EUV light is generated in the vacuum chamber.

25. The method of claim 21, wherein the free radicals and the gas that flows from the perimeter region of the element flow radially inward from the region at a perimeter of the element toward a center region of the element.

26. A control system for controlling free radical and gas flow in an extreme ultraviolet (EUV) light source, the control system comprising:

one or more electronic processors;

a non-transient computer-readable medium coupled to the one or more electronic processors, the computer-readable medium comprising instructions that, when executed, cause the one or more electronic processors to:

direct a gas through an aperture of an element in a vacuum chamber of an extreme ultraviolet (EUV) light source, the gas having a first flow rate and the gas flowing from a first side of the element to a second side of the element, the second side of the element comprising a surface that is exposed to plasma debris;

direct a perimeter flow from an outer perimeter region of the second side of the element inside of the vacuum chamber, the perimeter flow comprising free radicals and a gas, the free radicals being directed through a conduit and the gas being directed through a gap formed between the outer perimeter of the element and a mount, a lip of the mount directing the gas toward the surface of the element; and adjust a total flow rate of the perimeter flow relative to a flow rate of the gas that flows through the aperture of the element.

27. The control system of claim 26, wherein the instructions to adjust the total flow rate of the perimeter flow relative to the flow rate of the gas that flows through the aperture of the element comprises instructions to adjust the total flow rate of the perimeter flow to be the same as the flow rate of the gas that flows through the aperture of the element.

28. A system for an extreme ultraviolet (EUV) light source, the system comprising:

an optical element;

a radical transport system comprising one or more conduits, each of the one or more conduits comprising a sidewall, the sidewall comprising a linear portion and a second portion, the linear portion of the sidewall comprising a first end that defines a first opening, and the second portion of the sidewall comprising one or more openings from an interior of the conduit to an exterior of the conduit; and a mount configured to hold the optical element with a gap between the mount and an outer perimeter of the optical element, the mount comprising a wall and a lip, the lip extending from the wall at an angle toward a surface of the optical element.

29. The system of claim 28, further comprising a control system, the control system configured to:

control a flow of free radicals through the one or more conduits, and control a flow of gas through the gap.

* * * * *